(12) United States Patent
Chen

(10) Patent No.: US 12,283,597 B2
(45) Date of Patent: Apr. 22, 2025

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventor: Wei-Lun Chen, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 81 days.

(21) Appl. No.: 18/360,855

(22) Filed: Jul. 28, 2023

(65) Prior Publication Data

US 2023/0387123 A1 Nov. 30, 2023

Related U.S. Application Data

(63) Continuation of application No. 17/824,953, filed on May 26, 2022, now Pat. No. 11,776,963, which is a continuation of application No. 16/945,342, filed on Jul. 31, 2020, now Pat. No. 11,348,921.

(51) Int. Cl.
*H01L 27/092* (2006.01)
*H01L 21/8238* (2006.01)

(52) U.S. Cl.
CPC .. *H01L 27/0924* (2013.01); *H01L 21/823821* (2013.01); *H01L 21/823828* (2013.01); *H01L 21/823878* (2013.01)

(58) Field of Classification Search
CPC ......... H01L 27/0924; H01L 21/823821; H01L 21/823828; H01L 21/823878; H01L 29/0673; H01L 29/42392; H01L 29/66439; H01L 29/775; H01L 29/78696; H01L 21/8221; H01L 21/823807; H01L 27/0688; H01L 27/092; B82Y 10/00
See application file for complete search history.

(56) References Cited

U.S. PATENT DOCUMENTS 9,356,027 B1 * 5/2016 Cheng ............. H01L 21/823821

* cited by examiner

*Primary Examiner* — Karen Kusumakar
*Assistant Examiner* — Adam S Bowen
(74) *Attorney, Agent, or Firm* — WPAT LAW; Anthony King

(57) ABSTRACT

A semiconductor structure includes: a substrate and a fin protruding from the substrate. The fin comprises a first semiconductive layer over the substrate, a second semiconductive layer over the first semiconductive layer, and a dielectric layer disposed between the first semiconductive layer and the second semiconductive layer and electrically isolated from the first semiconductive layer and the second semiconductive layer. The semiconductor structure further includes a gate electrode including: a first conductive portion extending along two opposite sidewalls of the first semiconductive layer and along an upper surface of the substrate; and a second conductive portion electrically isolated from the first conductive portion and extending along two opposite sidewalls of the second semiconductive layer and along an upper surface of the fin.

20 Claims, 34 Drawing Sheets

SEMICONDUCTOR STRUCTURE AND METHOD OF MANUFACTURING THE SAME

PRIORITY CLAIM AND CROSS-REFERENCE

This application is a continuation application of U.S. non-provisional application Ser. No. 17/824,953 filed May 26, 2022, which is a continuation application of U.S. non-provisional application Ser. No. 16/945,342 filed Jul. 31, 2020, now U.S. Pat. No. 11,348,921B2 the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls. Although existing FinFET devices and methods of fabricating FinFET devices have been generally adequate for their intended purposes, they have not been entirely satisfactory in all respects. For example, a variation of fin width and profile, especially at an end of the fin, raises challenges in a FinFET process development. It is desired to have improvements in this area.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
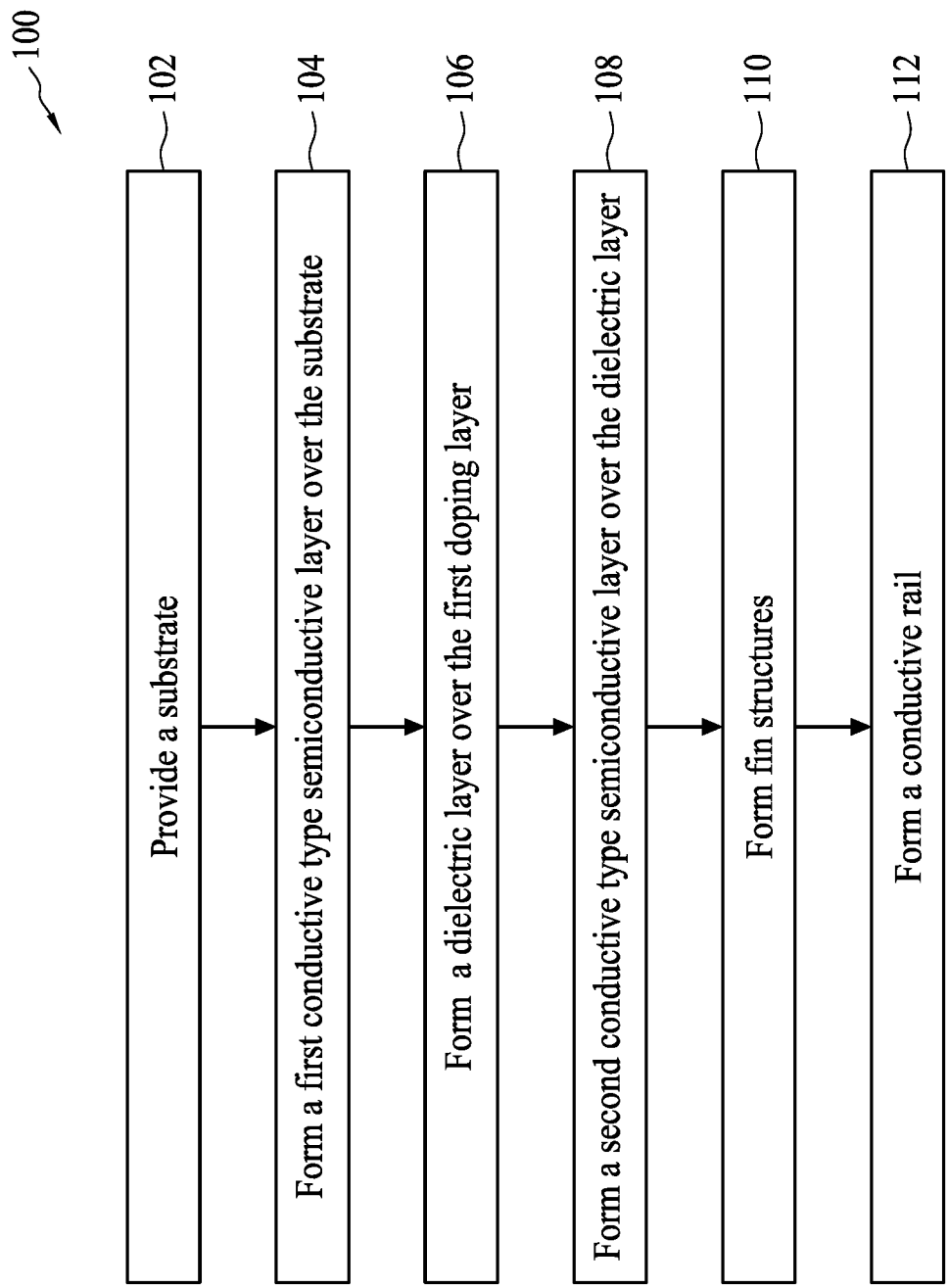
FIG. 1 is a flow chart illustrating a method of fabricating a semiconductor structure, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a typical semiconductor structure, a P-type metal-oxide-semiconductor (PMOS) device and an n-type metal-oxide-semiconductor (NMOS) device are formed separately. Such Metal-oxide-semiconductor (MOS) devices are basic building elements in integrated circuits. An existing MOS device typically has a gate electrode comprising polysilicon doped with p-type or n-type impurities, using doping operations such as ion implantation or thermal diffusion. For an NMOS device, the work function may be adjusted nearly that of the conduction band of silicon. For a PMOS device, the work function may be adjusted to close to nearly that of the valence band of silicon. Adjusting the work function of the polysilicon gate electrode can be achieved by selecting appropriate impurities.

The feature (e.g., fin) density is important for transistors because higher feature density improves the performance of transistors. To increase feature density, area scaling technologies, such as lithography-driven pitch scaling or critical dimension (CD) scaling, are employed. For example, the fins are patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. However, these area scaling technologies are expensive and may encounter limitations, such as tunneling effect. As the semiconductor industry has progressed into nanometer technology process nodes in pursuit of higher device density, higher performance, and lower costs, alternative strategies for increasing fin density are required.

Examples of devices that can benefit from one or more embodiments of the present invention are semiconductor devices. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Q-gate) devices, or Pi-gate (I-gate) devices.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Method 100 of forming a semiconductor structure is illustrated in FIG. 1, and one or more semiconductor structures formed by such a methodology are illustrated in FIGS. 2 to 21. It is understood that parts of method 100 and/or the semiconductor structure 200 may be fabricated by a well-known complementary metal-oxide-semiconductor (CMOS) technology process flow, and thus some processes are only briefly described herein. Further, the semiconductor structure 200 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor structure 200 includes a plurality of semiconductor devices (e.g., transistors), which may be interconnected.

FIG. 1 is a flow chart of a method 100 for manufacturing a semiconductor structure according to various aspects of the present disclosure. In the present embodiment, Method 100 is for manufacturing a semiconductor structure that includes a fin structure. The method 100 includes a number of operations (e.g. 102, 104, 106, 108, 110 and 112). The method for manufacturing the semiconductor structure 200 will be further described according to one or more embodiments. It should be noted that the operations of the method for manufacturing the semiconductor structure 200 may be rearranged or otherwise modified within the scope of the various aspects. It should further be noted that additional processes may be provided before, during, and after the method 100, and that some other processes may only be briefly described herein. Thus, other implementations are possible within the scope of the various aspects described herein.

FIGS. 2-20 illustrate diagrammatic cross-sectional side views of one embodiment of semiconductor structure 200 at various stages of fabrication, according to the method 100 of FIG. 1. In some embodiments, semiconductor structure 200 includes any fin-based device, including double-gate field effect transistor, tri-gate field effect transistor (TGFET), multi-gate field-effect transistor (MuGFET). FIG. 21 illustrates a diagrammatic perspective view of semiconductor structure 200 in accordance with the present invention. Semiconductor structure 200 may be included in a microprocessor, memory cell, and/or other integrated circuit device. FIGS. 2-21 have been simplified for the sake of clarity to better understand the inventive concepts of the present disclosure. Additional features can be added in the semiconductor structure 200, and some of the features described below can be replaced or eliminated in other embodiments of the semiconductor structure 200.

The method 100 begins at operation 102 where a substrate 210 is provided or received. In some embodiments, the substrate 210 includes a silicon substrate (e.g., wafer). The substrate 210 may be silicon in a crystalline structure. In other embodiments, the substrate 210 may include other elementary semiconductors such as germanium in a crystalline structure; a compound semiconductor, such as silicon germanium, silicon carbide, gallium arsenic, gallium phosphide, indium phosphide, indium arsenide, and/or indium antimonide; or combinations thereof. In some embodiments, the substrate 210 includes a silicon-on-insulator (SOI) substrate. The SOI substrate may be fabricated using separation by implantation of oxygen (SIMOX), wafer bonding, and/or other suitable methods. The substrate 210 may further include other suitable features. In some embodiments, the substrate 210 can include isolation structures (i.e., shallow trench isolation (STI) structures) (not shown) interposing regions accommodating different devices.

Figure 2:
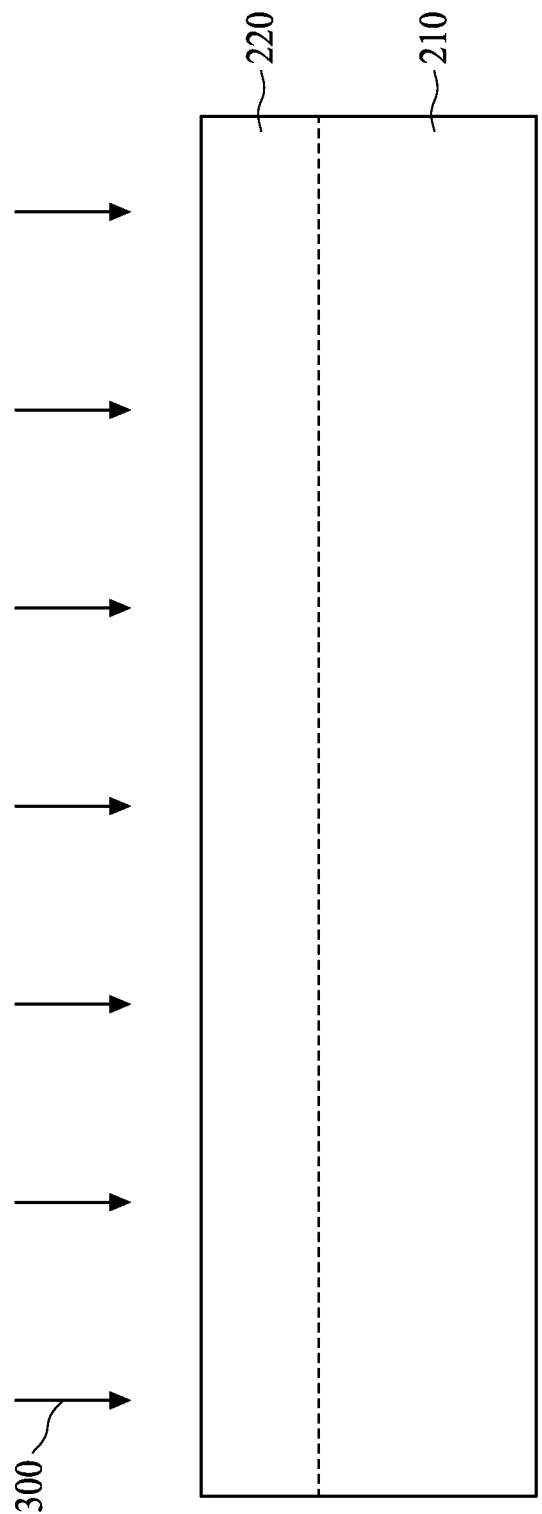
FIGS. 2 to 16C illustrate diagrammatic cross-sectional side views of various embodiments of a semiconductor structure at various stages of fabrication, according to the method of FIG. 1.

At operation 104, with reference to FIG. 2, a first conductive type semiconductive layer 220 is formed over the substrate 210 and may be a Fin field effect transistor (FinFET). For example, a dopant implantation (symbolized by an arrow 300) may be performed to form the first conductive type semiconductive layer 220. The first conductive type semiconductive layer 220 may be an n-type doped layer or a p-type doped layer. By way of example, a p-type dopant may include boron, aluminum, gallium, indium, or other p-type acceptor material; and an n-type dopant implanted via the ion implantation process may include arsenic, phosphorous, antimony, or other n-type donor material.

Figure 3:
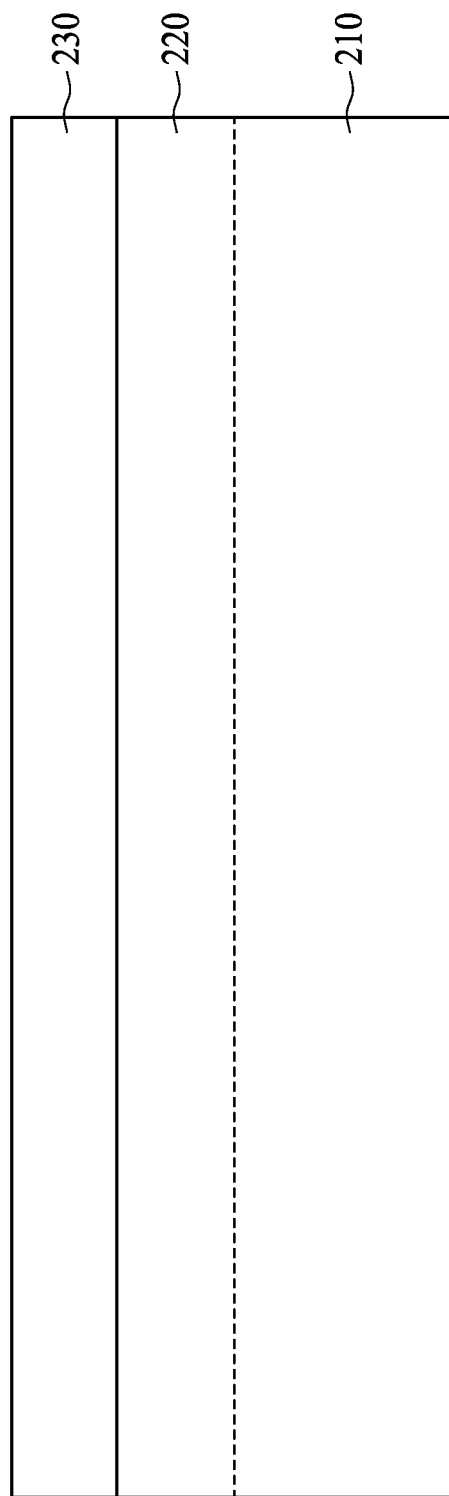

With reference to FIG. 3, when the first conductive type semiconductive layer 220 is p-type doped, a p-channel layer 230 may be formed over the first conductive type semiconductive layer 220 through various methods. In some embodiments, the p-channel layer 230 is formed by an epitaxial growth process. In various embodiments, epitaxy technique comprises CVD deposition technique (such as, vapor phase epitaxy (VPE) and/or ultra-high vacuum CVD (UHV-CVD)), molecular beam epitaxy and/or other suitable technique. In some embodiments, the p-channel layer 230 comprises epitaxially grown SiGe (SiGe$_n$), wherein n is the Ge component with atomic percentage. In some embodiments, the dopant implantation may use a dopant that includes germanium so as to form the p-channel layer 230 over the p-type region. The p-channel layer 230 may be made of Ge-containing materials, such as SiGe, Ge, GeSn and the like. Such germanium implantation may be employed to change the threshold voltage of transistors (such as field effect transistors). The threshold voltage may be a value of the gate-source voltage when a conducting channel of the transistor just begins to connect source and drain contacts of the transistor, allowing significant current to flow. In one example, the threshold voltage may be changed by controlling a dosage of the germanium dopant implantation, where a magnitude of the change in the threshold voltage may be proportional to the dosage. In this manner, the threshold voltage of the field effect transistor may be tuned by controlling aspects of the germanium dopant implantation. In an example, the p-channel layer 230 includes from about 20% to about 50% germanium. In some embodiments, the p-channel layer 230 has a thickness between about 20 nm and about 80 nm. In some embodiments, the p-channel layer 230 has a thickness between about 30 nm and about 70 nm. In some embodiments, the p-channel layer 230 has a thickness between about 40 nm and about 60 nm.

Figure 4:
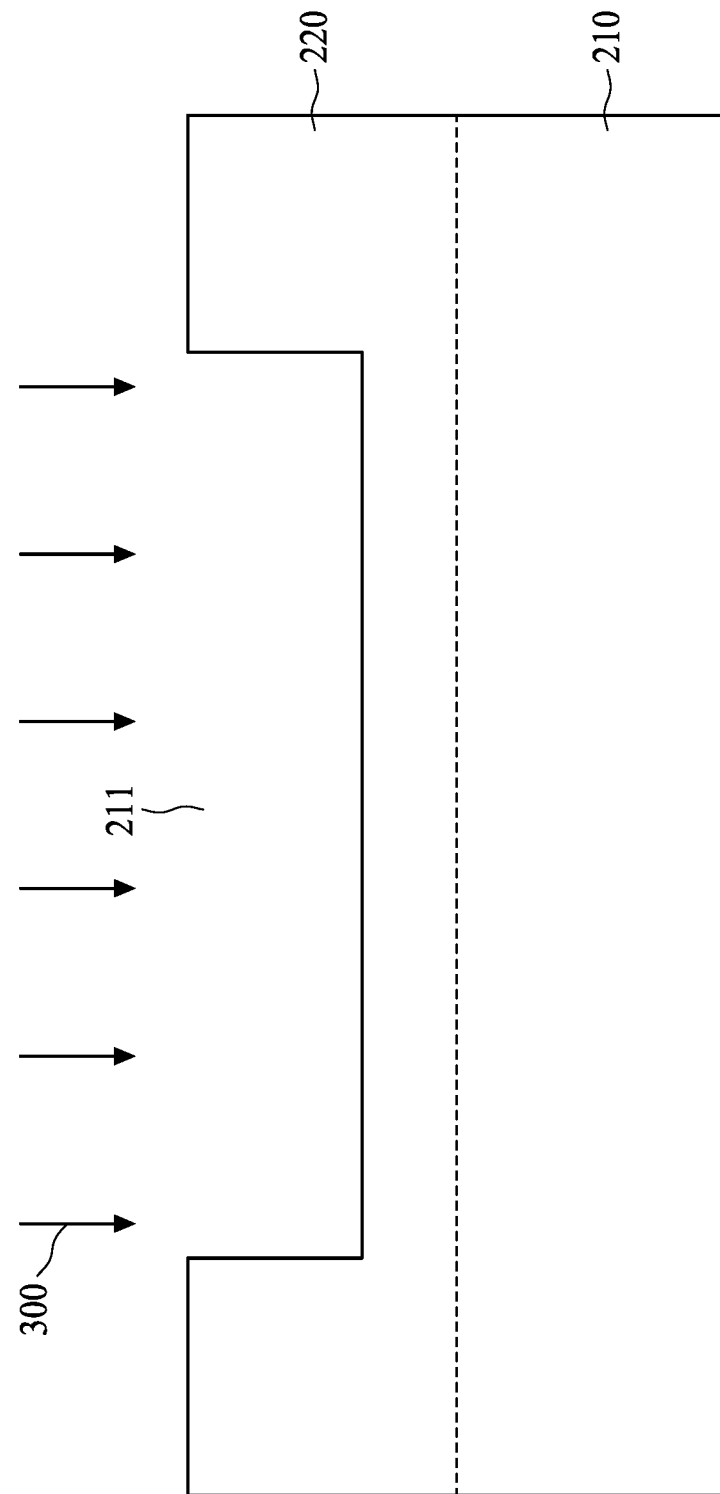
Figure 5:
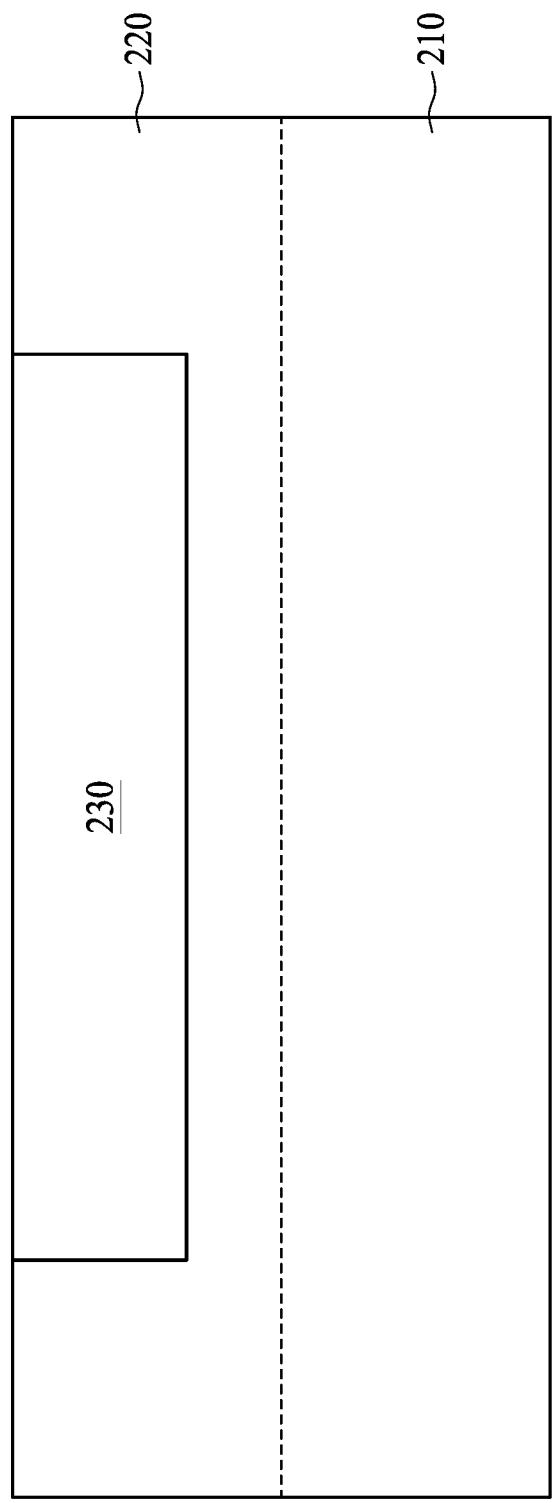

With reference to FIGS. 4 and 5, in an alternative embodiment, when the first conductive type semiconductive layer 220 is doped with p-type dopants, the substrate 210 may be provided with a recess 211 before the dopant implantation is performed. The recess 211 may be formed by etching the substrate 210. The first conductive type semiconductive layer 220 is formed under the bottom of the recess 211 and the p-channel layer 230 is formed in the recess 211 by an epitaxial growth process.

Figure 6A:
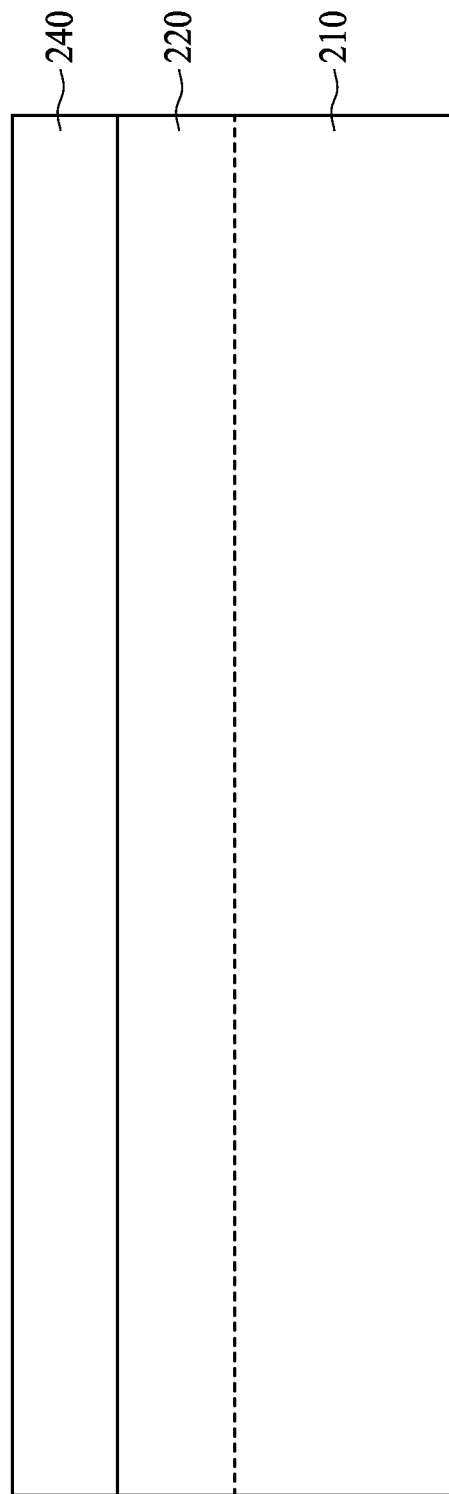
Figure 6B:
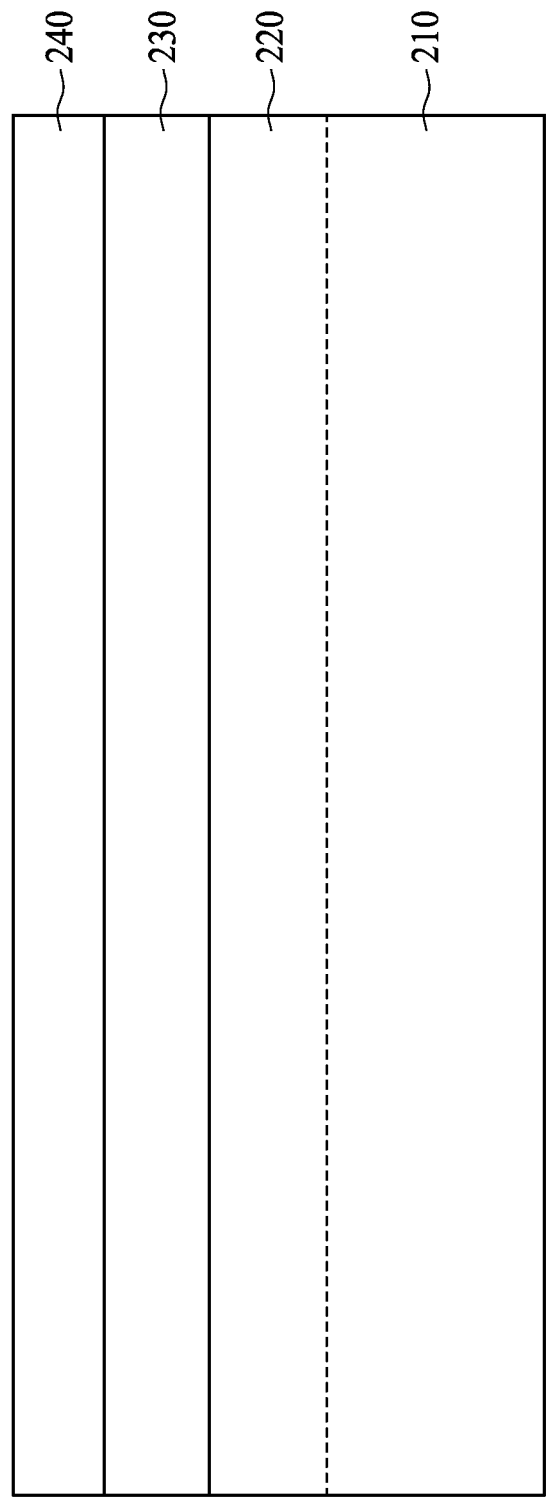
Figure 6C:
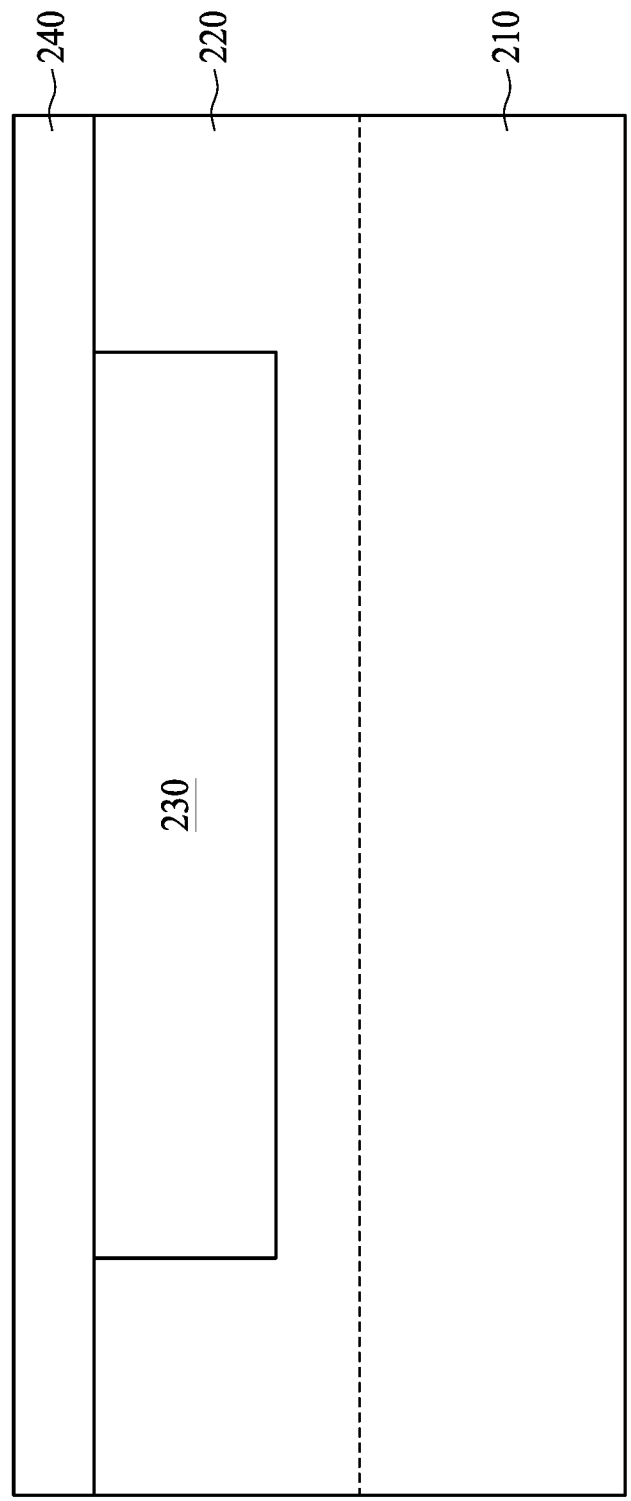
Figure 6D:
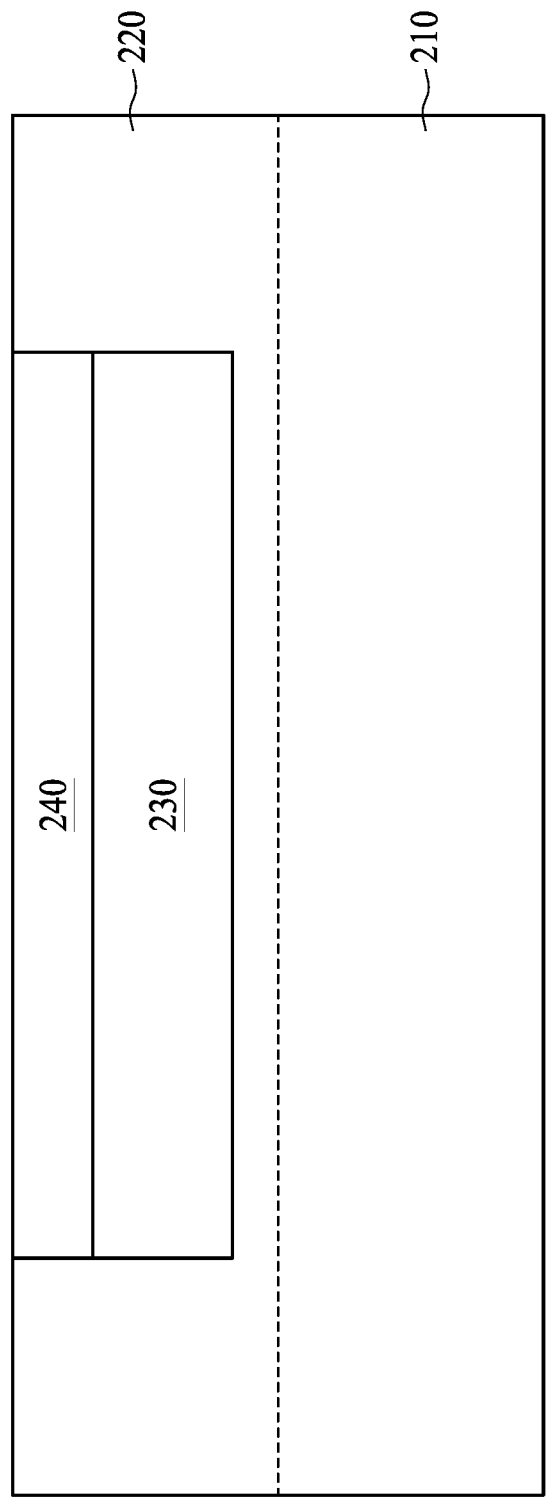
Figure 7A:
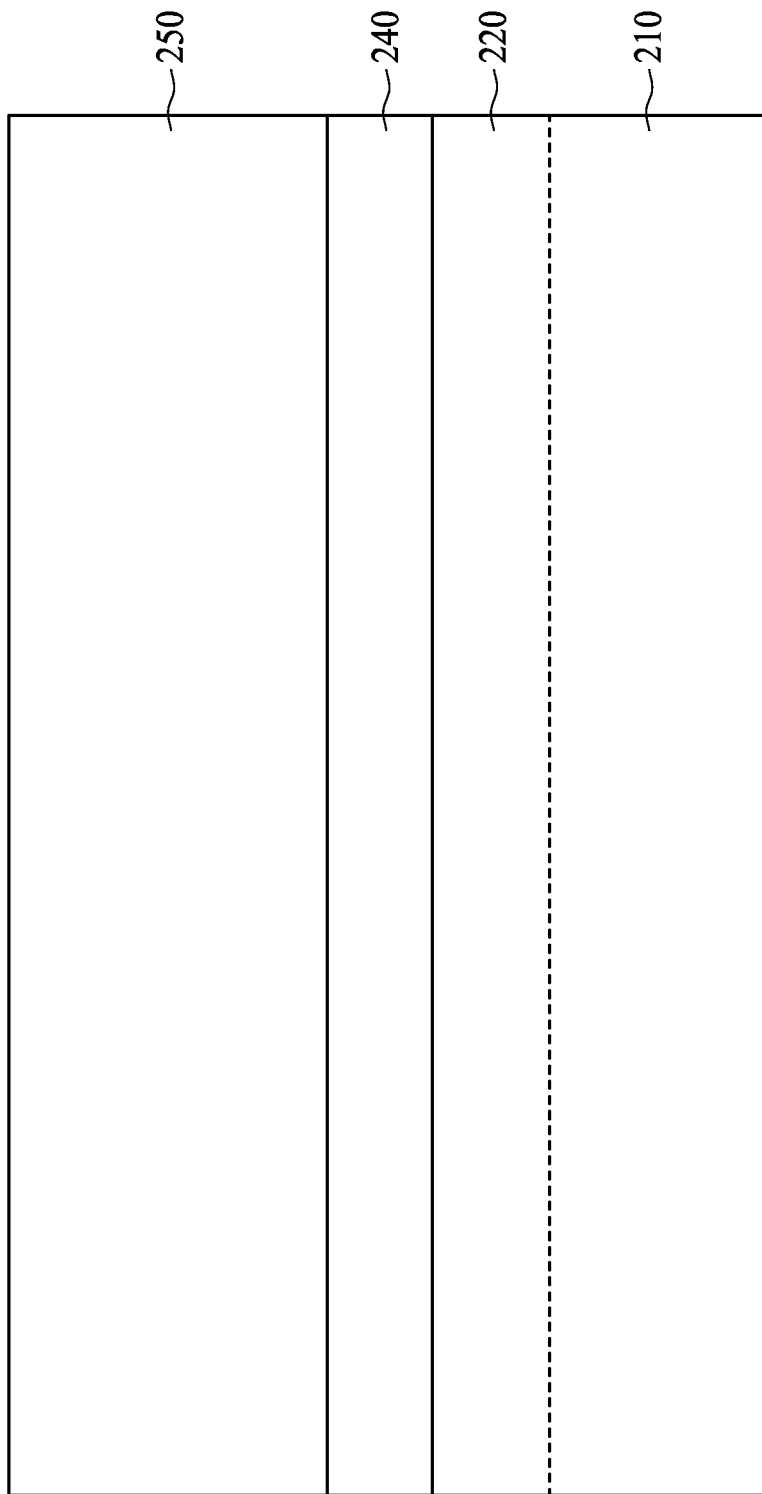
Figure 7B:
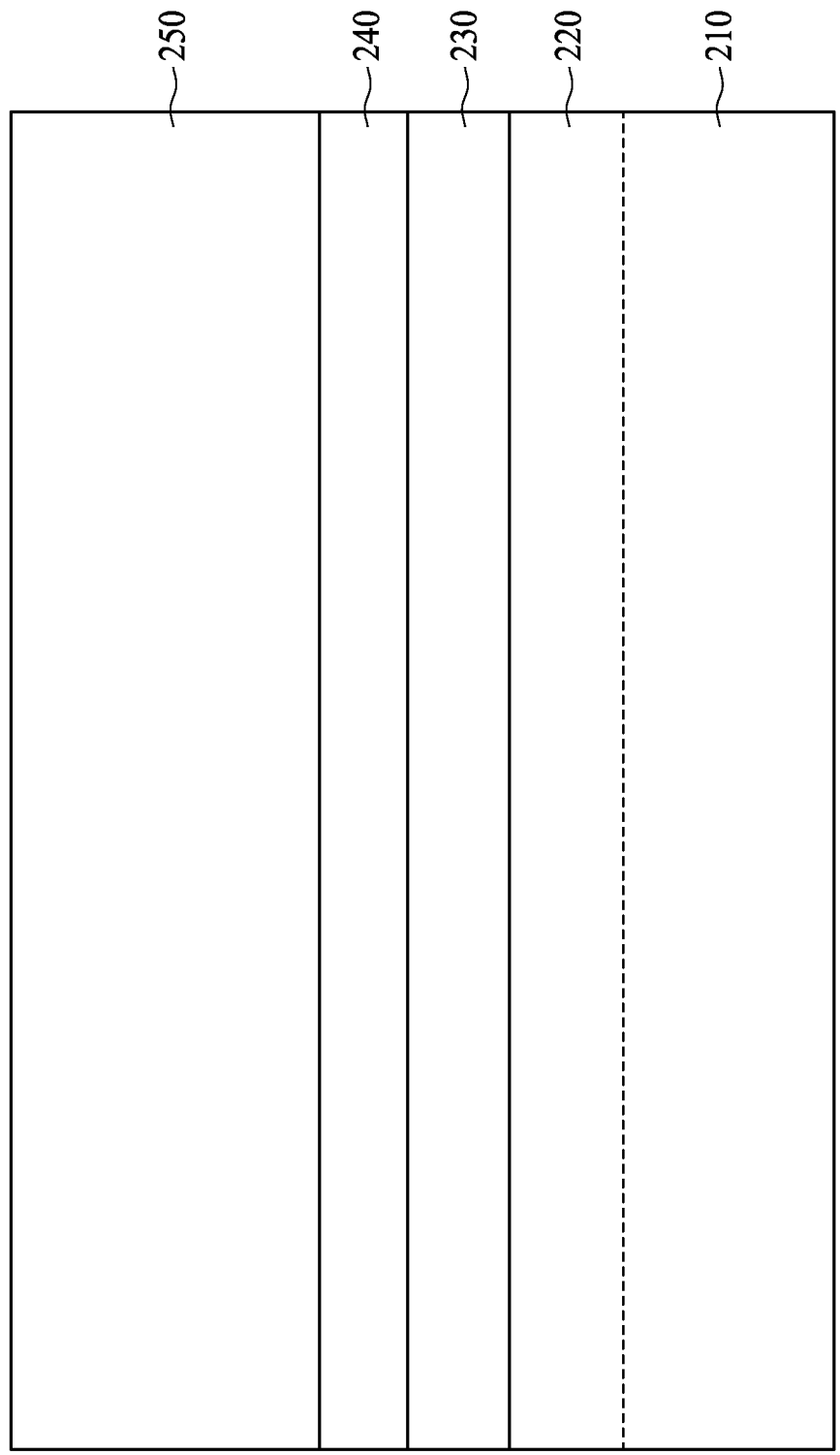
Figure 7C:
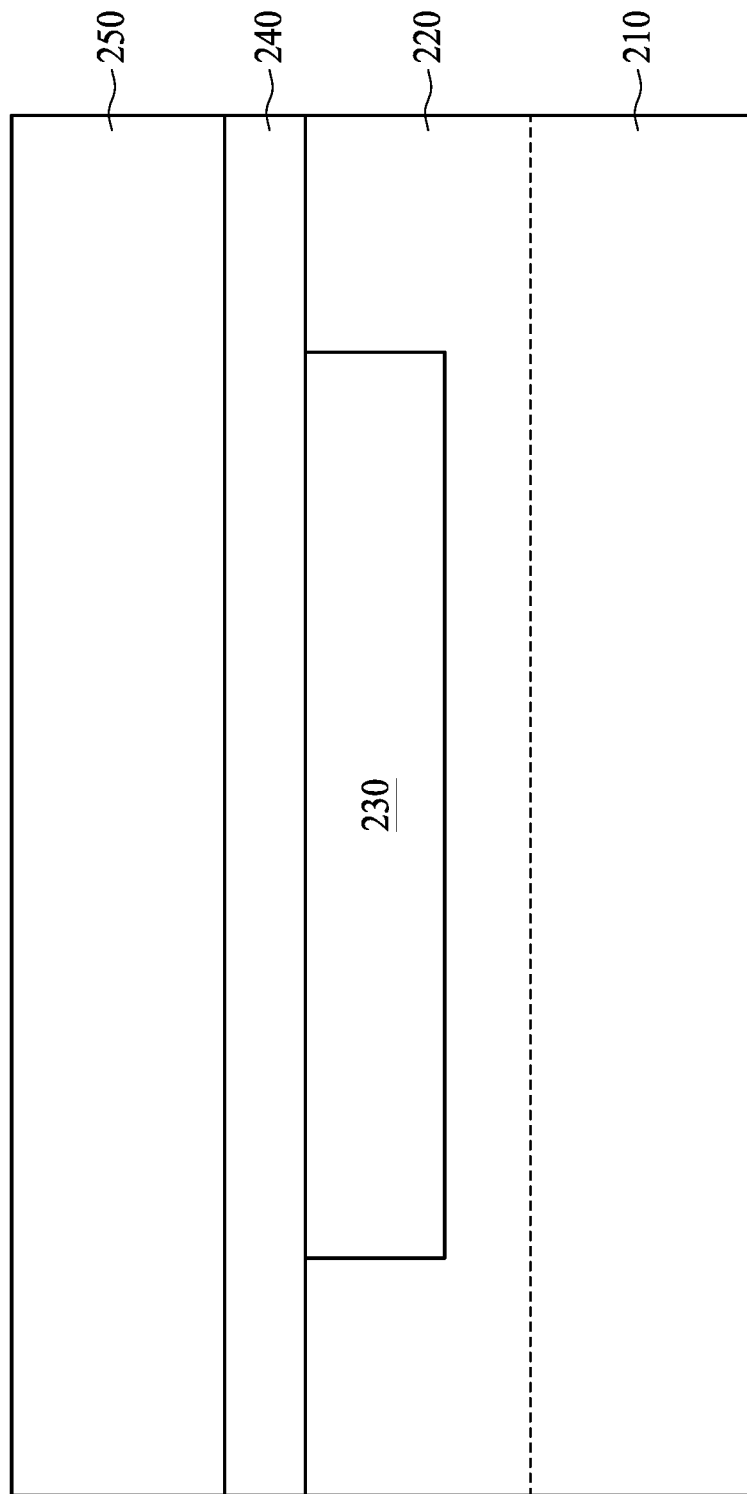
Figure 7D:
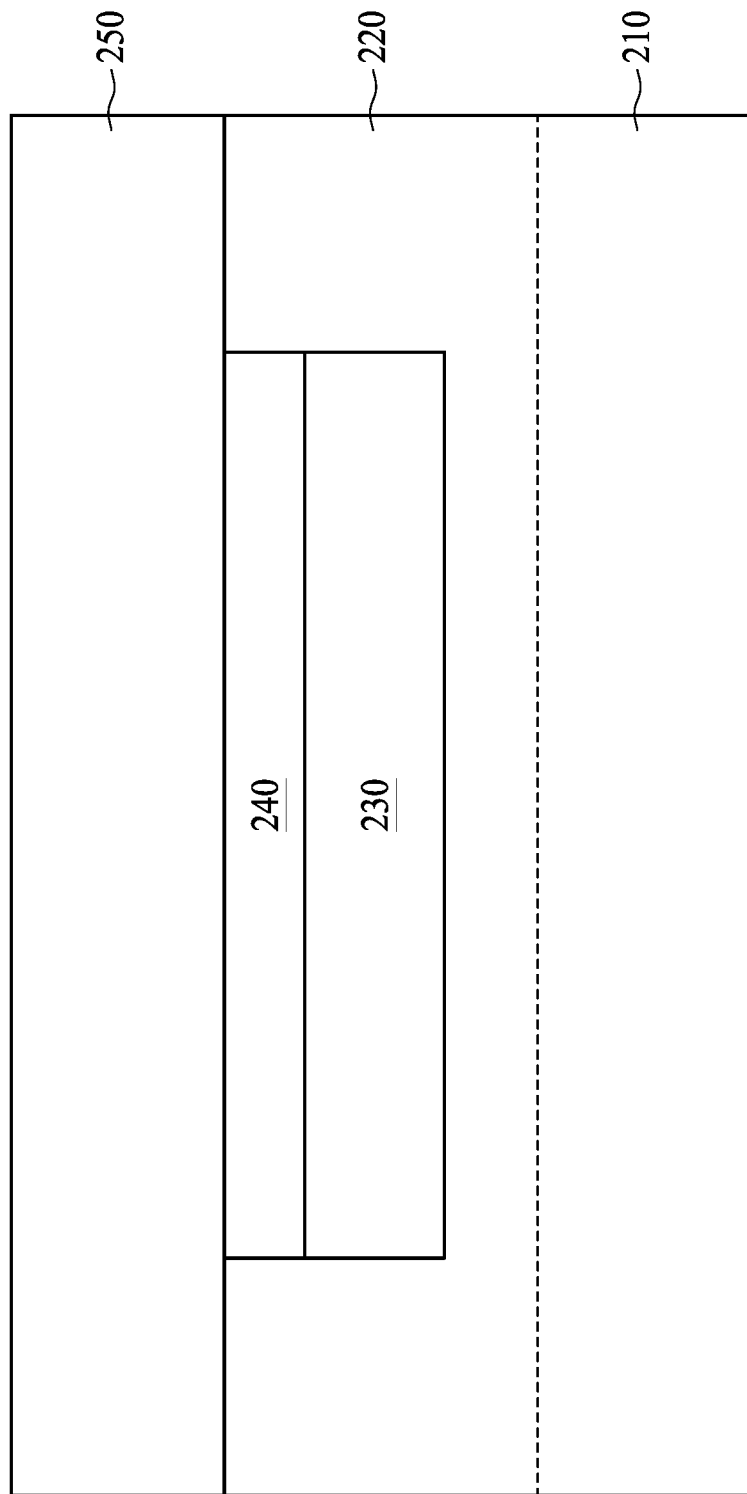

With reference to FIGS. 6A to 6C, the method 100 proceeds to operation 106 where a dielectric layer 240 is disposed over the first conductive type semiconductive layer 220 or over the p-channel layer 230. In the embodiments where the recess 211 is formed in the substrate 210 as shown in FIG. 6D, the dielectric layer 240 may be also formed over the p-channel layer 230 in recess 211. For example, the dielectric 240 is formed through deposition of dielectric materials, such as silicon oxide, silicon nitride, silicon oxynitride, or combinations thereof. In some embodiments, the dielectric material has a dielectric constant from about 3 to about 25. In some embodiments, the dielectric material may be SiO$_2$, silicon oxynitride, Si$_3$N$_4$, HfO$_2$, ZrO$_2$ and the like.

In some embodiments, the dielectric layer 240 is made of a low-κ dielectric material to improve resistive-capacitive (RC) delay. The dielectric constant of the low-κ dielectric material is lower than that of silicon dioxide (SiO$_2$). One approach to reduce the dielectric constant of a dielectric material is to introduce carbon (C) or fluorine (F) atoms. For example, in SiO$_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 240 is formed by, for example, chemical vapor deposition (CVD), spin coating, or combinations thereof. In some embodiments, the dielectric layer 240 has a thickness from about 5 nm to about 50 nm. In some embodiments, the dielectric layer 240 has a thickness from about 10 nm to about 40 nm. In some embodiments, the dielectric layer 240 has a thickness from about 10 nm to about 30 nm.

At operation 108, with reference to FIGS. 7A to 7D, formed over the dielectric layer 240 is a second conductive type semiconductive layer 250, which may be a Fin field effect transistor (FinFET). In some embodiments, the second conductive type semiconductive layer 250 may be epitaxially grown Si. The second conductive type semiconductive layer 250 has a type of dopants different from that of the first conductive type semiconductive layer 220. The second conductive type semiconductive layer 250 has a thickness from about 20 nm to about 150 nm. In some embodiments, the second conductive type semiconductive layer 250 has a thickness from about 30 nm to about 120 nm. In some embodiments, the second conductive type semiconductive layer 250 has a thickness from about 40 nm to about 100 nm.

The method 100 continues with operation 110 where fin structures are formed. Forming the fin structures may include forming a photoresist layer or a capping layer (such as an oxide capping layer) over the second conductive type semiconductive layer 250, patterning the photoresist or capping layer to have openings that expose portions of the stacking structure (including the first conductive type semiconductive layer 220, the dielectric layer 240, and the second conductive type semiconductive layer 250 and/or the p-channel layer 230), and etching the exposed portions of the stacking structure. In some embodiments, the stacking structure can be etched using a dry etching process. Alternatively, the etching process is a wet etching process, or combination dry and wet etching process. A photolithography process may be included to facilitate the etching process, which may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the photolithography process is implemented or replaced by other methods, such as maskless photolithography, electron-beam writing, and ion-beam writing. In yet some other embodiments, the photolithography process could implement nanoimprint technology.

Figure 8:
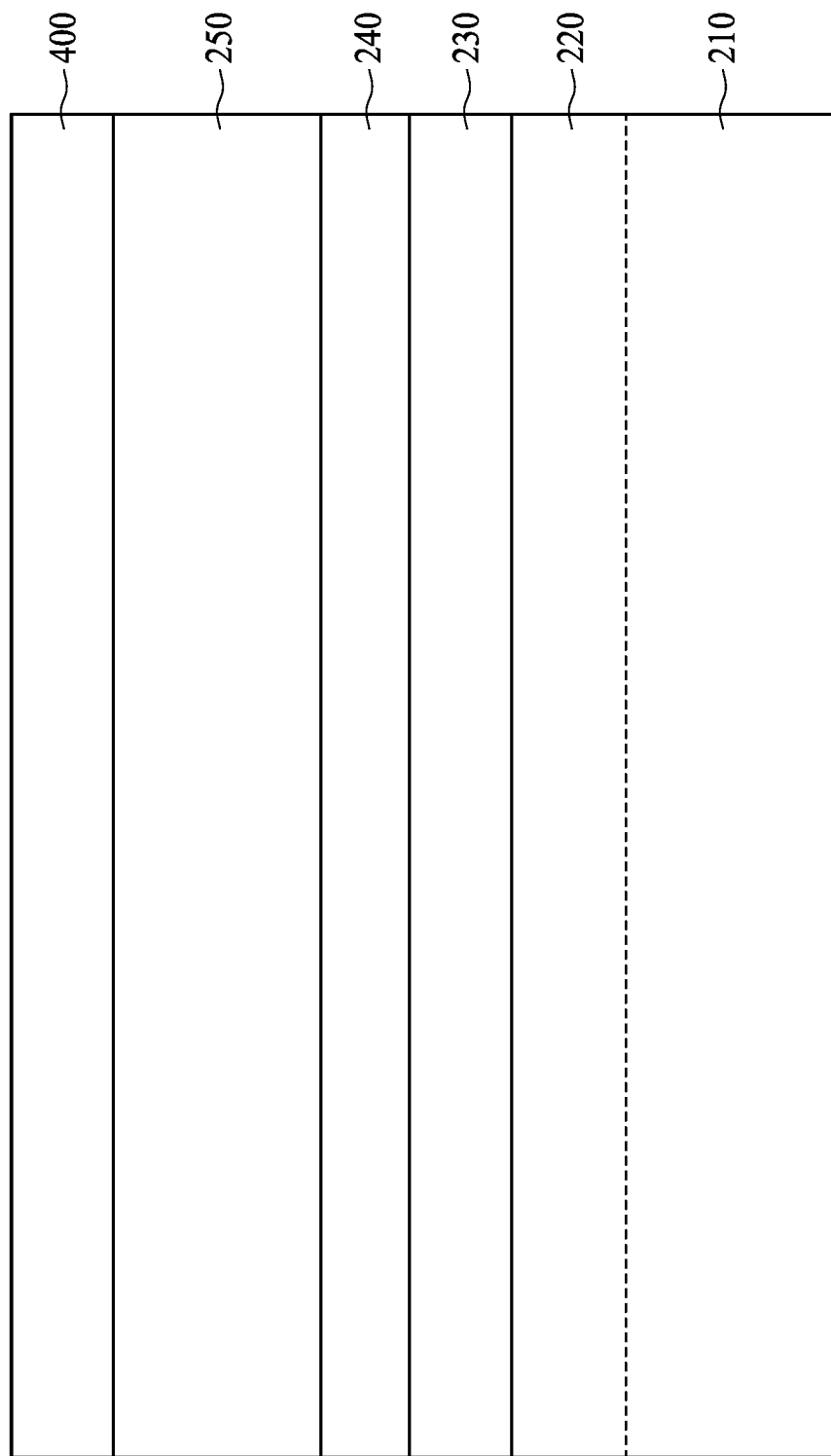
Figure 9:
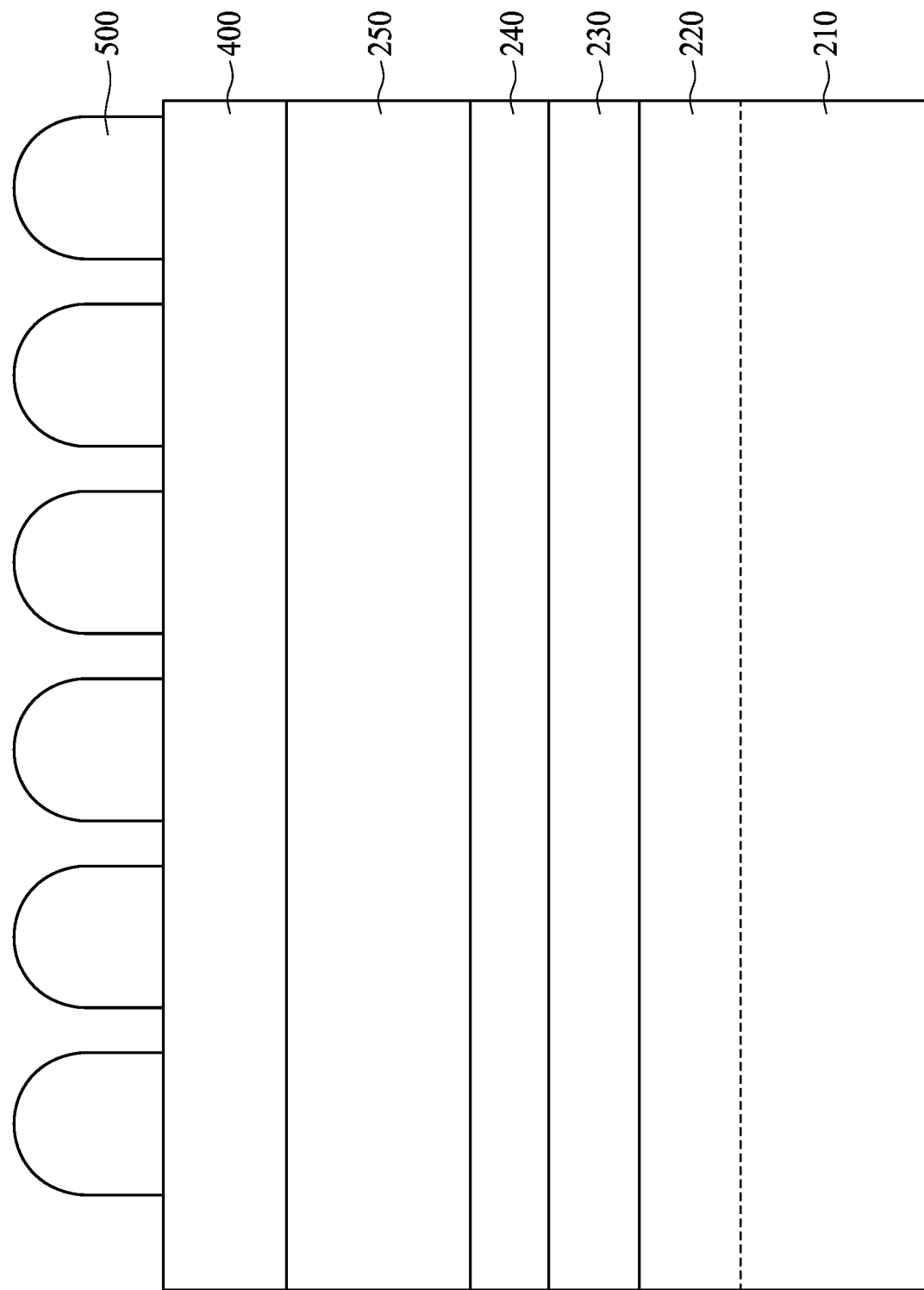
Figure 10:
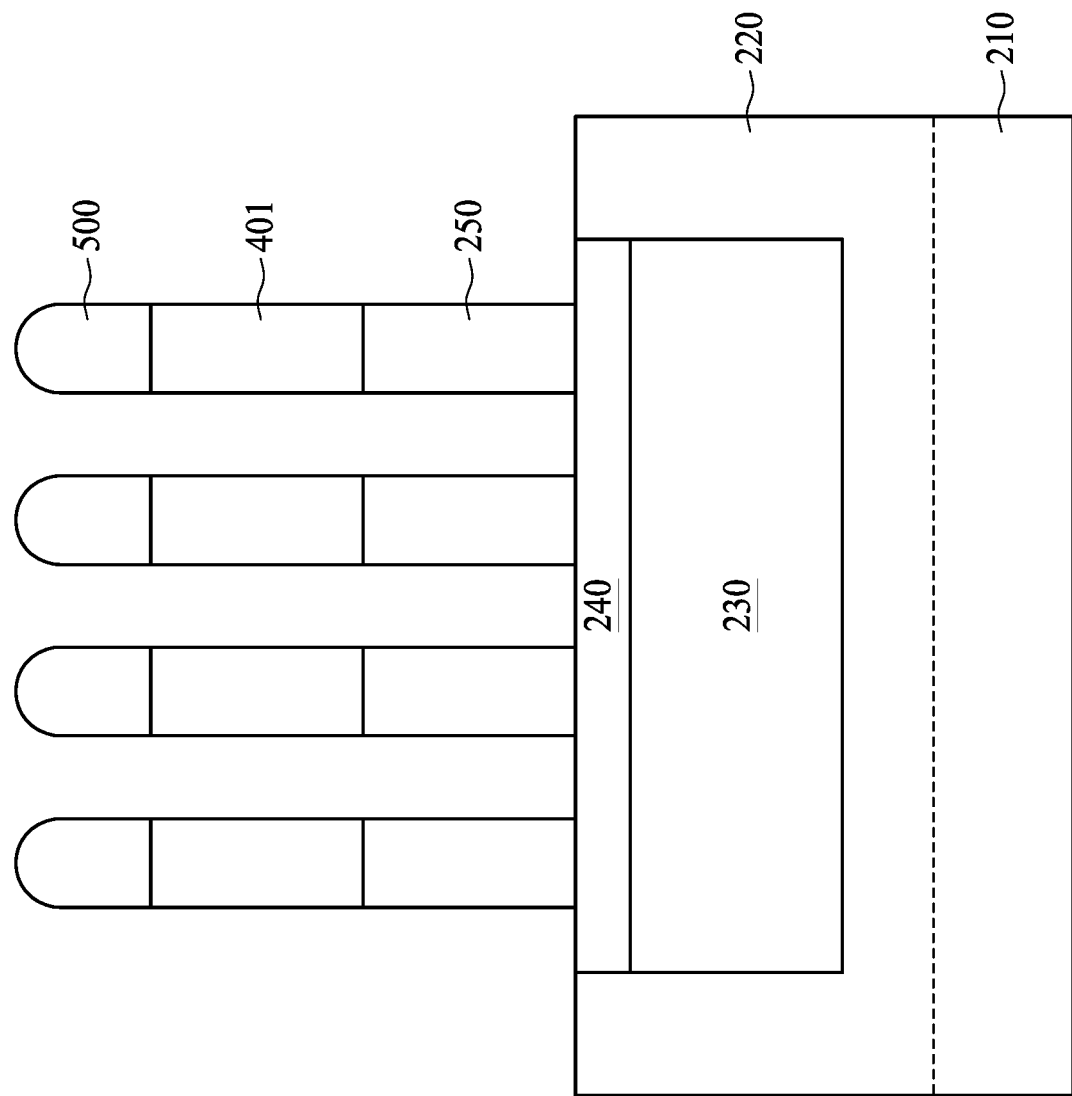

In some embodiments, the fin structures are formed by a photolithography and etching process. The photolithography and etching process includes application of hard mask and photoresist, exposure, developing, etching, and photoresist removal. In some embodiments, as shown in FIGS. 8 and 9, a mask layer 400 is applied onto the second conductive type semiconductive layer 250 with any suitable thickness and then photoresist 500 is applied onto the mask layer 400 by, for example, spin coating. The mask layer 400 may be a hard mask, which includes silicon oxide (such as SiO$_2$, silicon oxynitride), silicon nitride (such as Si$_3$N$_4$), silicon oxynitride, silicon carbide, metal oxide (such as HfO$_2$, ZrO$_2$) and/or other suitable materials. The mask layer 400 may be formed using methods such as CVD or PVD. The mask layer 400 has a thickness from about 20 nm to about 100 nm. The photoresist 500 may be patterned using any photolithographic techniques. For example, the photoresist 500 is irradiated (exposed) in accordance with a desired pattern (the semiconductor fin structures in this case) and developed to remove portions of the photoresist material. The remaining photoresist 500 protects the underlying material from subsequent processing steps, such as etching. Mask layer 400 is patterned to remove portions uncovered by the remained photoresist 500 to form a hard mask 401, which may have a higher density and hardness than the photoresist 500.

The second conductive type semiconductive layer 250, the dielectric layer 240 and the first conductive type semiconductive layer 220 are etched based on the pattern of the photoresist 500 and the hard mask 401 to form a plurality of fins through a plasma ash process (plasma ashing processing), a dry etch process (dry ditching process), a wet etch process (wet ditching process) or other suitable techniques. For example, the dry etch process may be performed with etchants, including oxygen-containing gas, fluoro-gas (such as $CF_4$, $SF_6$, $CH_2F_2$, $CHF_3$ or $C_2F_6$), chlorine-containing gas (such as $Cl_2$, $CHCl_3$, $CCl_4$ or $BCl_3$), bromine-containing gas (such as HBr and/or $CHBr_3$), other suitable gases and/or plasma, and/or its combination. For example, a wet etch process can be used with $NH_4OH$, HF (hydrofluoric acid) or the HF of dilution, deionized water, TMAH (TMAH), other suitable wet etching solution.

Figure 11:
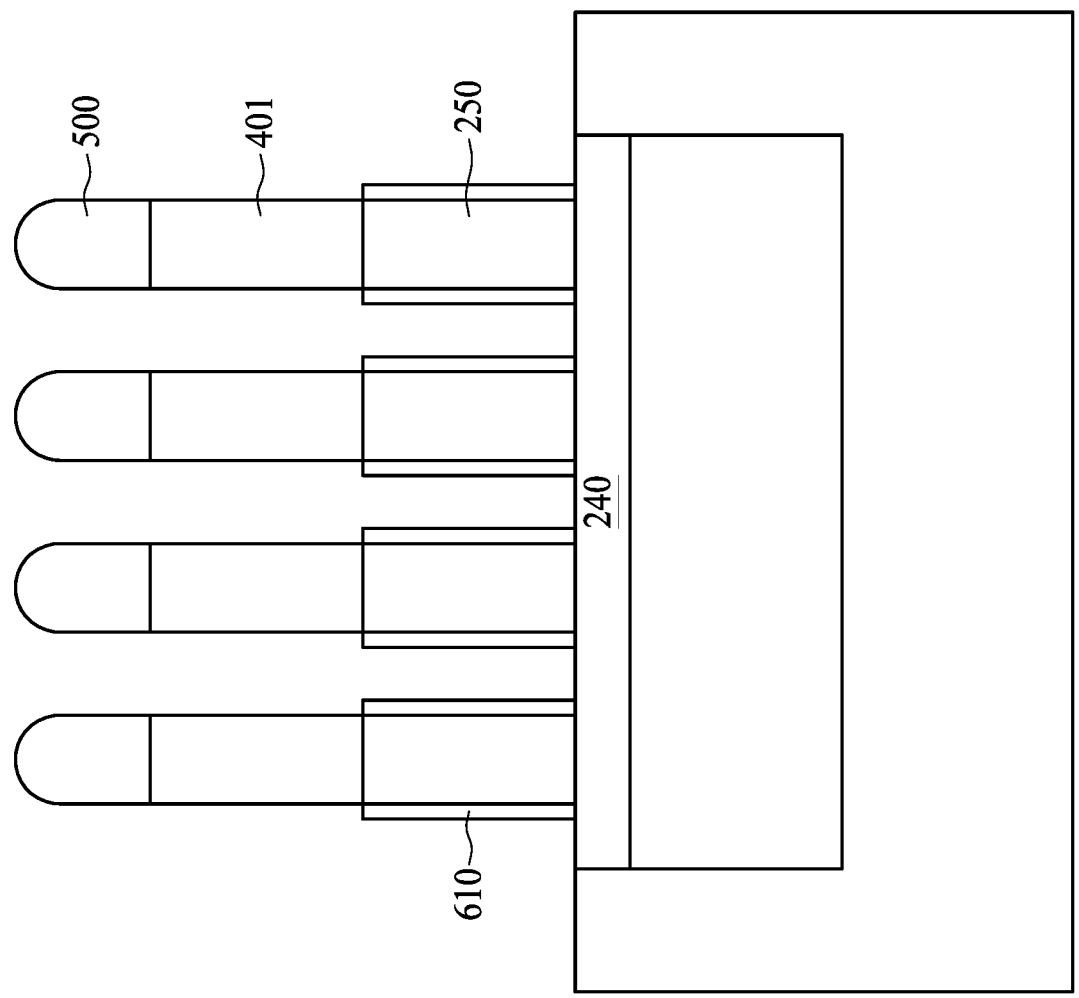
Figure 12:
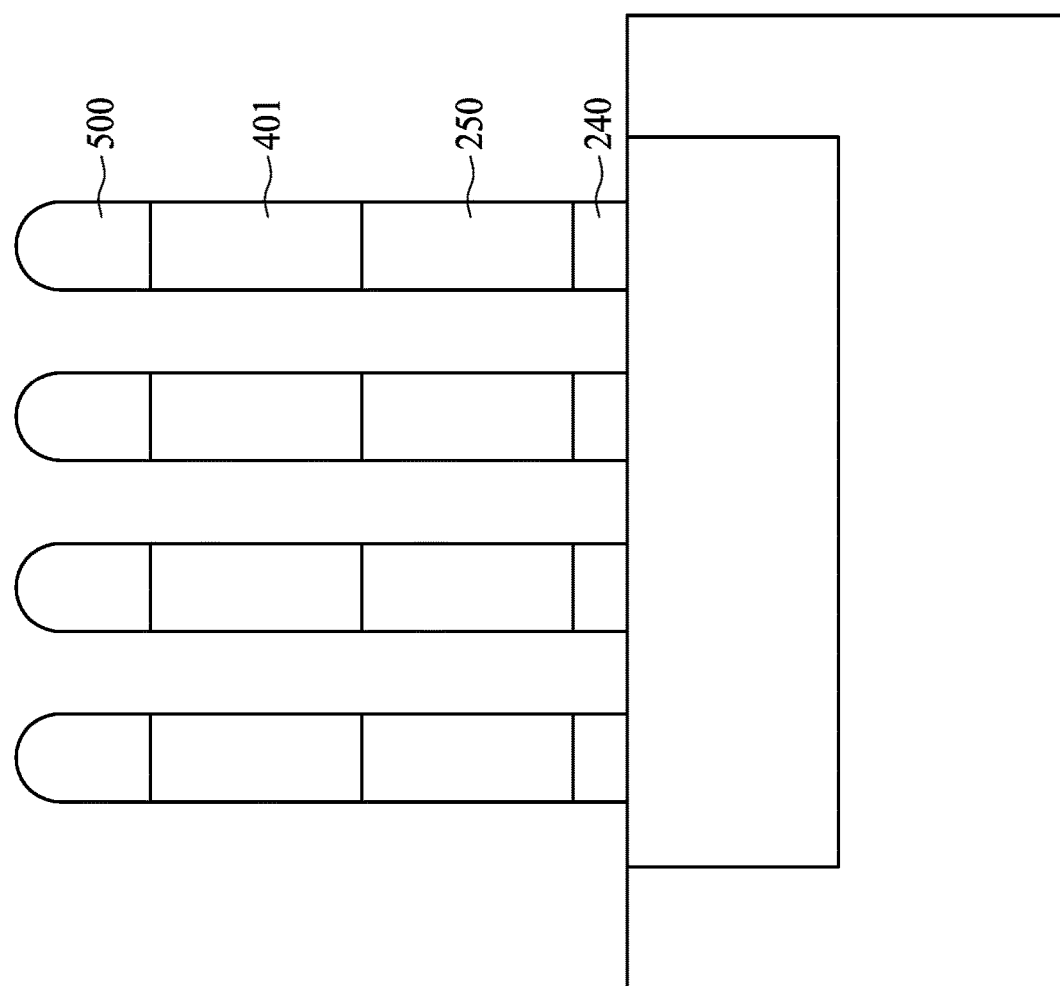

In some embodiments, a multiple etching process may be performed. As shown in FIGS. 10 to 14, a first etching is conducted by removing portions of the second conductive type semiconductive layer 250 uncovered by the photoresist 500 and the hard mask 401; a second etching is conducted by removing portions of the dielectric layer 240; and a third etching is conducted by removing portions of the first conductive type semiconductive layer 220 along with the p-channel layer 230 when the p-channel layer 230 is present, so as to form fin structures based on the patterns of the photoresist 500 and the hard mask 401. Additional operation may be performed after the first etching so as to form sacrificial film 610 on the sides of the etched second conductive type semiconductive layer 250, as shown in FIG. 11. In some embodiments, the formation of sacrificial film 610 is performed by oxidizing the sidewall of the etched second conductive type semiconductive layer 250 to form an oxide layer. After the second etching, sacrificial film 610 may remain unchanged or be removed according to the materials of sacrificial film 610, etchants used for the second etching and the like. In some embodiments, sacrificial film 610 is partially removed and leave the etched second conductive type semiconductive layer 250 still covered by the remained sacrificial film 610.

During formation of sacrificial film 610, several factors are considered, for example, the etching selectivity between the sacrificial film and the dielectric layer 240. In some embodiments, the etchant used during the second etching for carving the dielectric layer 240 is selected to have lower etch rate to the sacrificial film than the dielectric layer 240.

Figure 13:
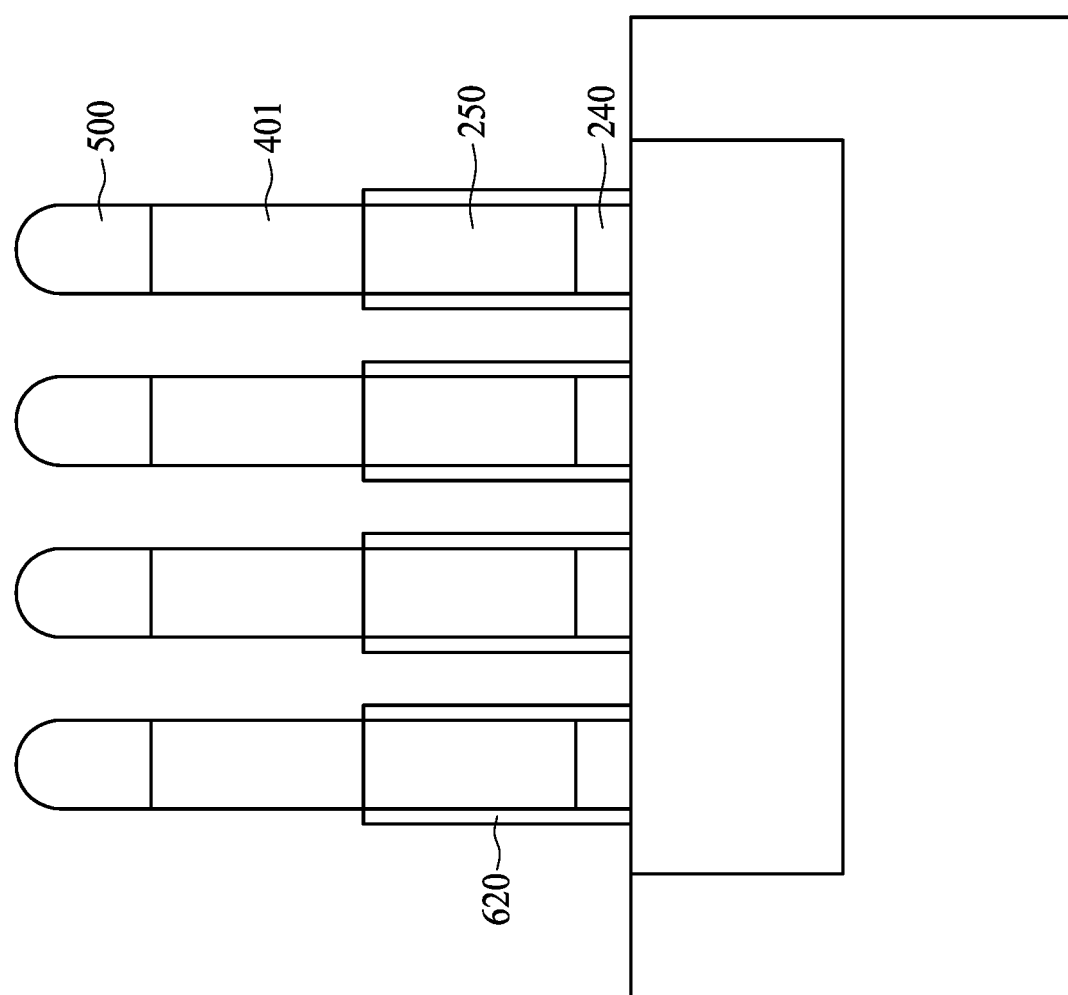
Figure 14:
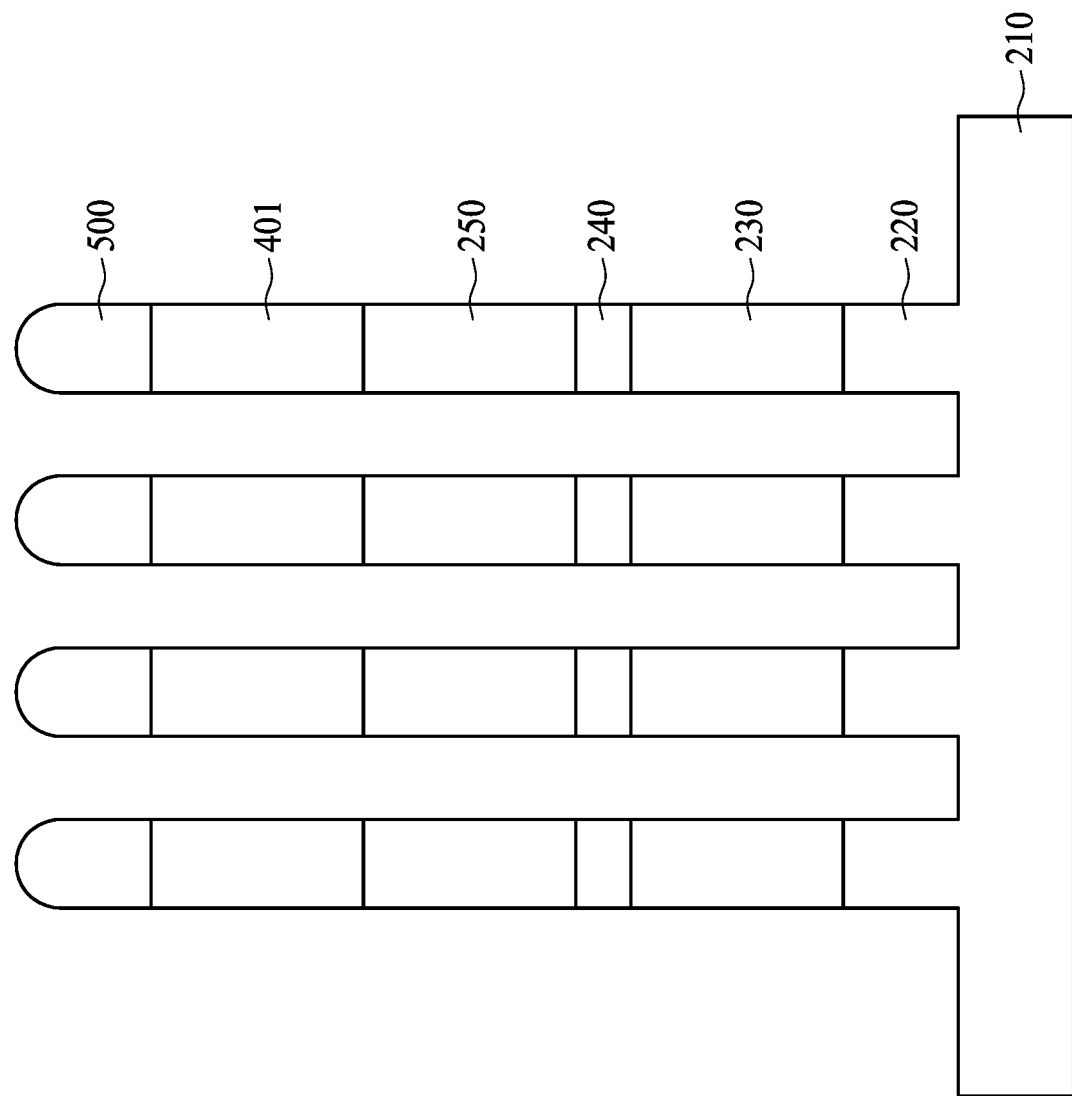

Additional operation may be performed after the second etching to form another sacrificial film 620 on the sides of both the etched dielectric layer 240 and the etched second conductive type semiconductive layer 250, as shown in FIG. 13. In some embodiments, the formation of sacrificial film 610 is performed by oxidization. If the prior sacrificial film 610 remained after the second etching, a portion of sacrificial film 620 is formed on the remained sacrificial film 610 and a portion of sacrificial film 620 is formed on the sidewall of the dielectric layer 240. In such case, sacrificial film 620 may have a non-uniform thickness, which is thicker around the dielectric layer 240 and thinner around the sacrificial film 610.

Sacrificial film 620 may remain unchanged or be removed according to the materials of sacrificial film 620, etchants used for the third etching and the like. In some embodiments, a portion of sacrificial film 620 may be removed without exposing the etched second conductive type semiconductive layer 250 and the etched dielectric layer 240. Sacrificial film 620 has to be thick enough to avoid the exposure of the etched second conductive type semiconductive layer 250 and the etched dielectric layer 240. Thickness of each of the sacrificial film 610 and the sacrificial film 620 varies depending on their materials, etchants used for the second and third etchings and the like. Each of the sacrificial film 610 and 620 may have a thickness in a range from about 0.5 nm to about 10 nm. In some embodiments, the thickness of sacrificial film 610 and 620 may range from about 1 nm to about 5 nm. Such sacrificial films 610 and 620 are used to protect the etched second conductive type semiconductive layer 250 and/or the etched dielectric layer 240 from the following etching process. The sacrificial film 620 may be removed during the third etching or by extra cleaning process.

In some embodiments, each etching is performed with plasma etching process. A gas mixture used in the plasma etching process comprises halogen-containing gas. In some embodiments, the gas mixture may further comprise additives and/or inert gas. The halogen-containing gas may be fluorocarbon-based chemistries ($C_xH_yF_z$, where each of x and z is an integer equal to or larger than 1 and y is 0 or an integer equal to or larger than 1), such as $CHF_3$, $CH_3F$, $C_4F_6$, $CF_4$ and the like; chlorine-based chemistries, such as $Cl_2$, $BCl_3$ and the like; or bromine-based chemistries, such as HBr. The additives may be $H_2$, $O_2$, $CO_2$, $SiCl_4$, etc. and enables the adjustment to better fit a variety of materials to be etched and fin profiles to be obtained. The inert gas, such as He, Ar and the like, may be added for adjusting the constitution of the gas mixture. The constitution of the gas mixture used in multiple etching steps may vary depending on the materials to be etched.

Figure 15C:
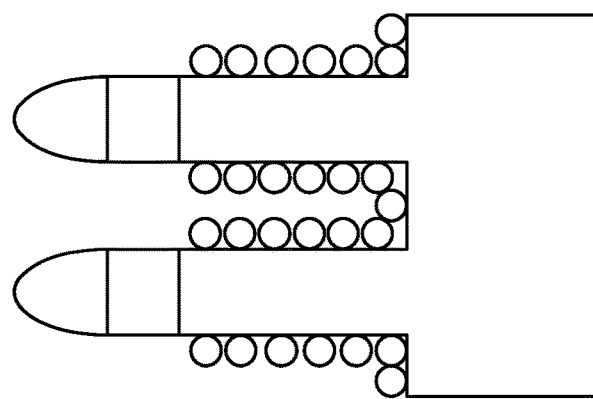
Figure 15B:
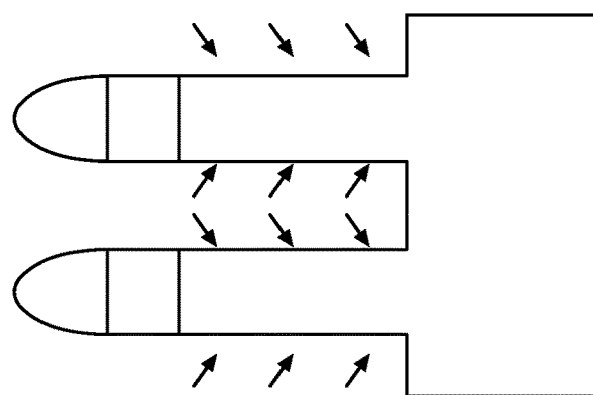
Figure 15A:
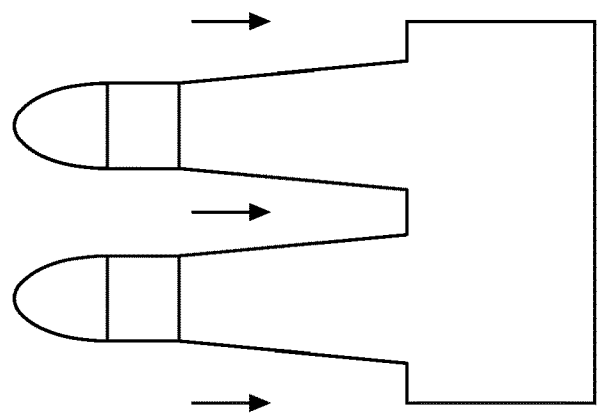

In some embodiments, in each etching, multi-cycle etching may be implemented to create a fin profile as desired. FIGS. 15A to 15C show an example of the multi-cycle etching. The multi-cycle etching comprises etching a target layer using a gas mixture containing chlorine-based chemistries or bromine-based chemistries to control the etching depth (FIG. 15A), and then introducing a gas mixture containing fluorocarbon-based chemistries to control the fin profile (FIG. 15B), which is followed by the additional oxidizing process to form sacrificial films (FIG. 15C) as mentioned above.

The fin profile provided by multi-cycle etching may vary depending on the materials of the second conductive type semiconductive layer 250, the etched dielectric layer 240, the p-channel layer 230 and the first conductive type semiconductive layer 220, as well as the gas mixtures used for each etching step. In some embodiments, as shown in FIG. 16A, each fin has a trapezoidal cross section in a vertical direction, in which the diameter of the top of the fin (i.e. the top of the second conductive type semiconductive layer 250 is smaller than that of the bottom of the fin (i.e. the first conductive type semiconductive layer 220). In some embodiments, the difference between the diameter of the top and that of the bottom of the fin is from about 0.5 nm to 3 nm. In some embodiments, the difference is from about 0.8 nm to 2 nm. In some embodiments, the difference is from about 1 nm to 1.5 nm. In some embodiments, as shown in FIG. 16B, each fin has a three-part profile, in which the first conductive type semiconductive layer 220 (and/or the p-channel layer 230) in the fin has a rectangular vertical cross section, the dielectric layer 240 in the fin has a trapezoidal vertical cross section where the top is smaller or larger than the bottom, and the second conductive type semiconductive layer 250 has a rectangular vertical cross section.

Figure 16C:
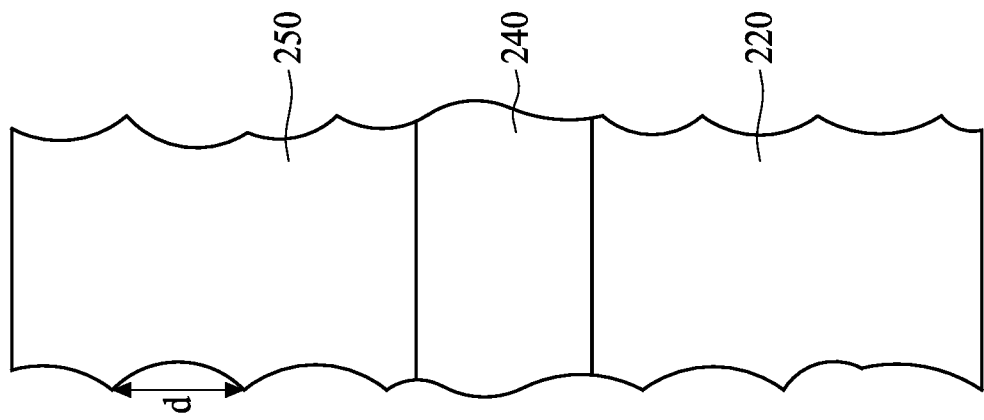
Figure 16B:
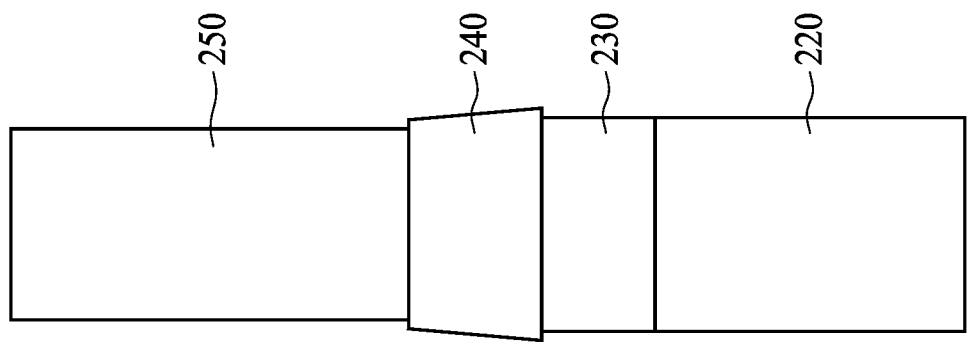
Figure 16A:
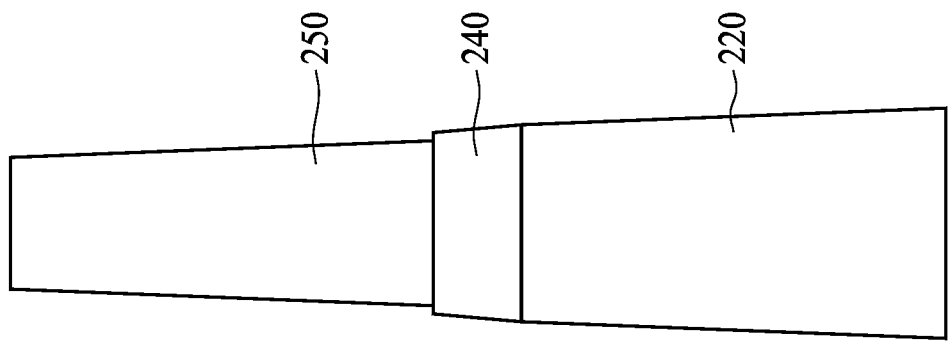

In some embodiments, as shown in FIG. 16C, each fin has a corrugated sidewall. The corrugated sidewall has a wavy surface having repetitive recesses and featured with a peak-to-peak distance d. In one embodiment, the peak-to-peak distance d of at least one of the first and the second conductive type semiconductive layer is uniform with a deviation within a predetermined value, for example, 10%. The peak-to-peak distance d in some embodiments may range from about 1 nm to about 10 nm. The peak-to-peak distance d in some embodiments may range from about 3 nm to about 8 nm. In some embodiments, the average peak-to-peak distance d in first conductive type semiconductive layer 220 is different form the second conductive type semiconductive layer 250. In some embodiments, the average peak-to-peak distance d in first conductive type semiconductive layer 220 is greater than the second conductive type semiconductive layer 250. In some embodiments, the average peak-to-peak distance d in first conductive type semiconductive layer 220 is smaller than the second conductive type semiconductive layer 250.

In some embodiments, dielectric layer 240 may have an oblate shape with narrower top and bottom than middle portion. In some embodiments, dielectric layer 240 may have a gourd shape (not shown) with narrower top, middle and bottom portions than other parts. In some embodiments, corrugation can be partially, for example, at least 50% of the area of sidewall is corrugated while others are flat. In some embodiments, at least 70% of the area of sidewall is corrugated. In some embodiments, at least 90% of the area of sidewall is corrugated.

The photoresist layer 500 and the hard mask 401 are then removed by any suitable cleaning step, such as ashing, stripping, or other suitable technique.

It should be noted that the second conductive type semiconductive layer 250 may be doped with n-type dopants or p-type dopants before or after the fin structures are formed. In some embodiments, a dopant implantation is performed onto the second conductive type semiconductive layer 250 before the fin structures are formed. For example, a p-type dopant may include boron, aluminum, gallium, indium, or other p-type acceptor material; and an n-type dopant implanted via the ion implantation process may include arsenic, phosphorous, antimony, or other n-type donor material.

In some embodiments, a dopant implantation is performed onto the second conductive type semiconductive layer 250 after the fin structures are formed. For example, the dopant implantation may be performed at a tilt angle. The tilt implantation may form a doped region in the second conductive type semiconductive layer 250 by controlling a dosage and a tilt angle θ with respect to the vertical axis. For example, the applied energy for the tilt implantation may be from about 10 KeV to about 80 KeV and the tilt angle is in a range from about 5° to about 70°. In some embodiments, the applied energy for the tilt implantation may be from about 30 KeV to about 70 KeV and the tilt angle is from about 150 to about 50°, but the disclosure is not limited thereto. In particular, the tilt angle may be chosen to cause an amount of doping at the sidewall portions and the top portions of the second conductive type semiconductive layer 250 of the fin structures to be approximately equal. In some examples, the top portions may have a slightly higher amount of doping as compared to the sidewall portions, but the difference in doping between the top and sidewall portions may be substantially reduced by selecting a suitable tilt angle.

Figure 17:
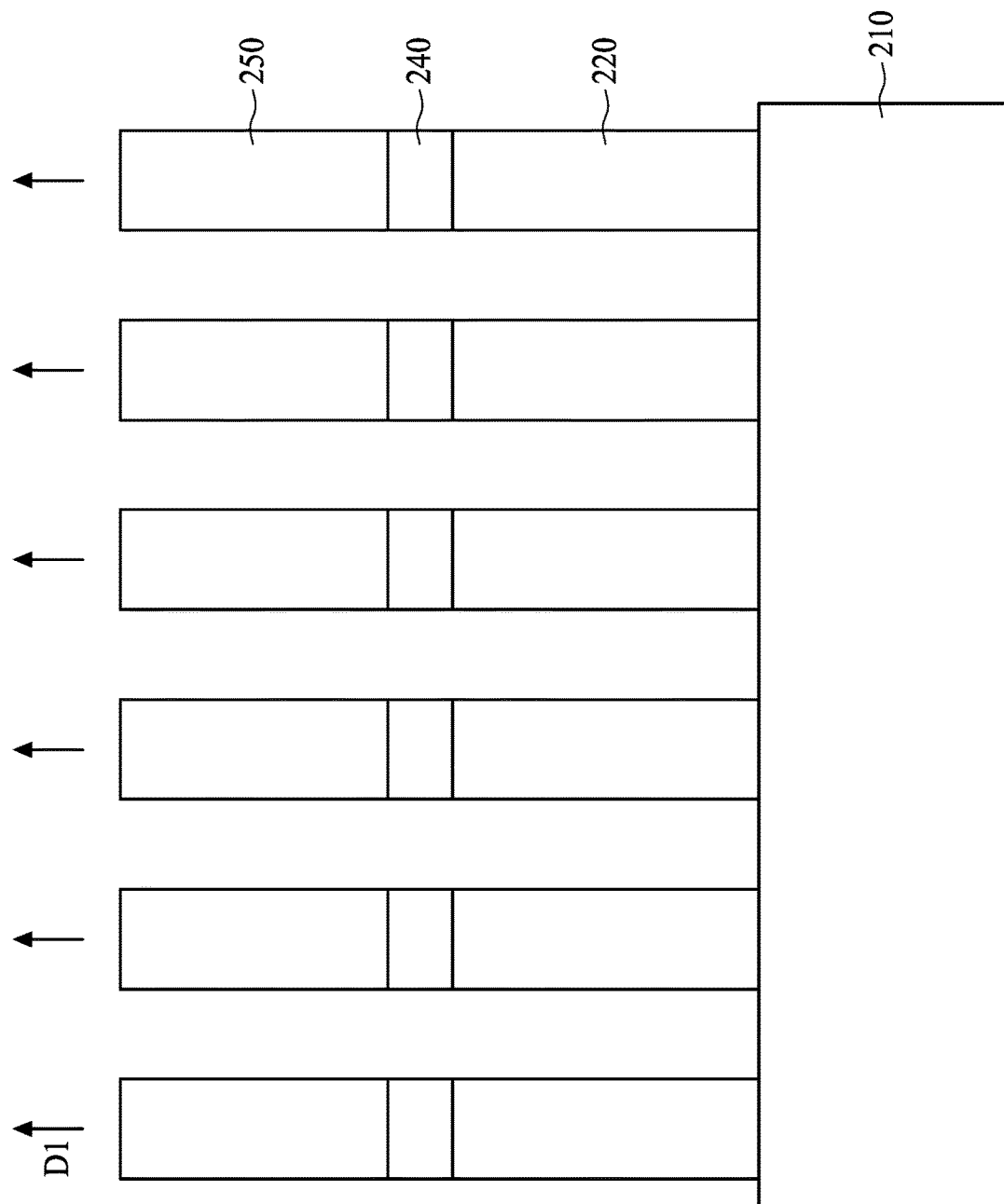
FIG. 17 illustrates a cross-sectional side view of a fin structure of the semiconductor structure in accordance with some embodiments of the present disclosure.

FIGS. 17 to 20 illustrate various embodiments of the semiconductor structure in accordance with the present invention. In FIG. 17, a semiconductor structure comprises a substrate 210 and a fin structure extruding from the substrate 210 along a first direction D1. The fin structure comprises the second conductive type semiconductive layer 250 stacking over the first conductive type semiconductive layer 220 along the first direction D1, and the dielectric layer 240 sandwiched by the first conductive type semiconductive layer 220 and the second conductive type semiconductive layer 250. The dielectric layer 240 provides electrical isolation along the first direction D1 between the first conductive type semiconductive layer 220 and the second conductive type semiconductive layer 250. In some embodiments, each fin may have a height from about 20 nm to about 300 nm. In some embodiments, each fin may have a height from about 50 to about 250 nm. In some embodiments, each fin may have a height from about 70 to about 200 nm. In some embodiments, each fin has a critical dimension (CD) of cross-fin direction in a range from about 3 nm to about 60 nm. In some embodiments, each fin has a critical dimension (CD) of cross-fin direction in a range from about 5 nm to about 50 nm. The pitch between two adjacent fins is from about 15 nm to about 100 nm. In another embodiment, the pitch between two adjacent tower structures is from about 20 nm to about 85 nm. In yet another embodiment, the pitch between two adjacent tower structures is from about 25 nm to about 70 nm. By stacking one conductive type semiconductive layer on another conductive type semiconductive layer in one single fin structure, higher density of transistors can be realized and the burden of area scaling for the conventional technique would be eliminated.

Figure 18:
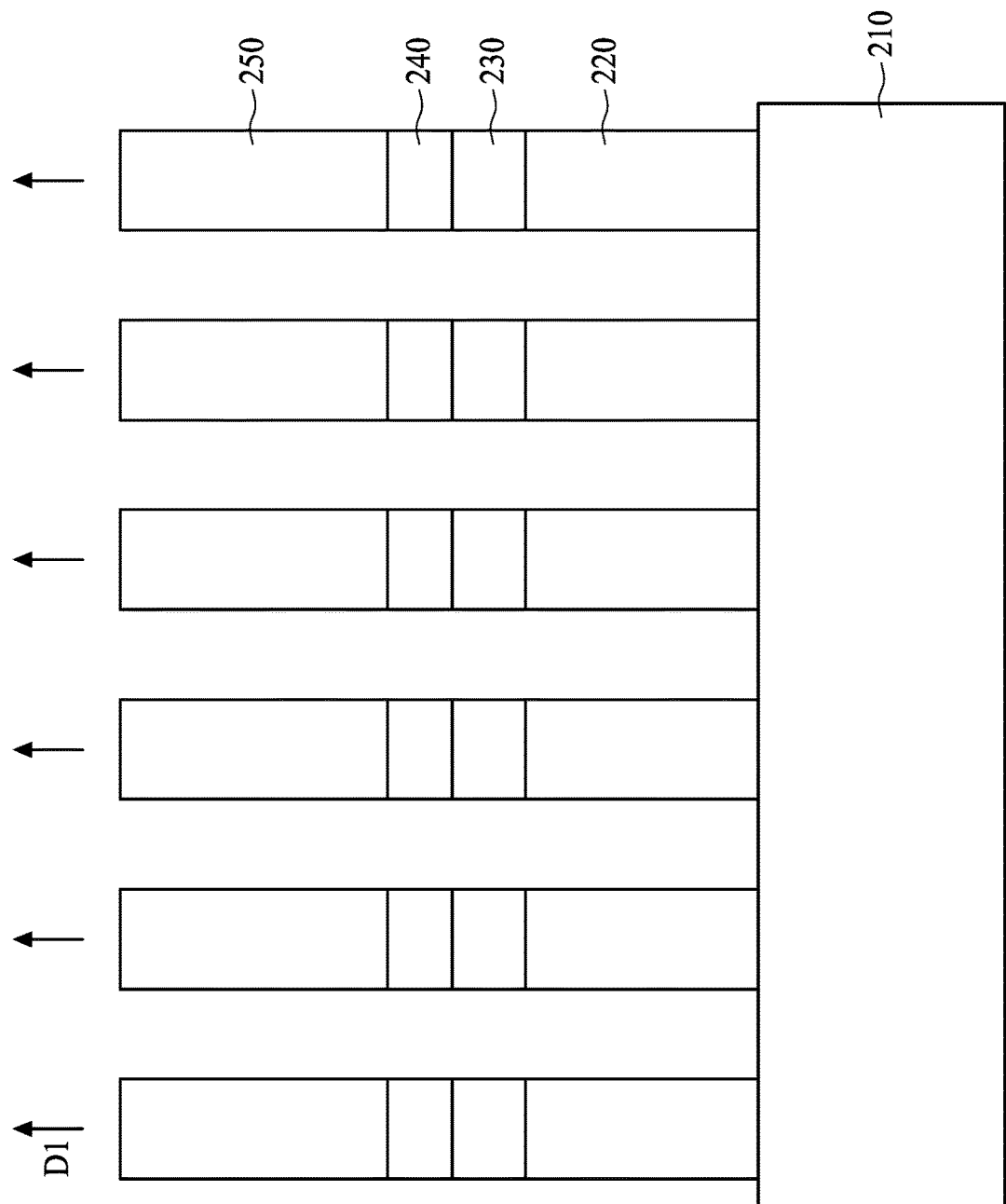
FIG. 18 illustrates a cross-sectional side view of a fin structure of the semiconductor structure in accordance with some embodiments of the present disclosure.

FIG. 18 illustrates a semiconductor structure comprising a substrate 210 and a fin structure extruding from the substrate 210 along a first direction D1. The fin structure comprises the second conductive type semiconductive layer 250, which is an N-type doped layer, stacking over the first conductive type semiconductive layer 220, which is a P-type doped layer, along the first direction D1, and the dielectric layer 240 sandwiched by the P-type doped layer and the N-type doped layer. The P-type doped layer further comprises a p-channel layer 230 adjacent to the dielectric layer 240.

Figure 19:
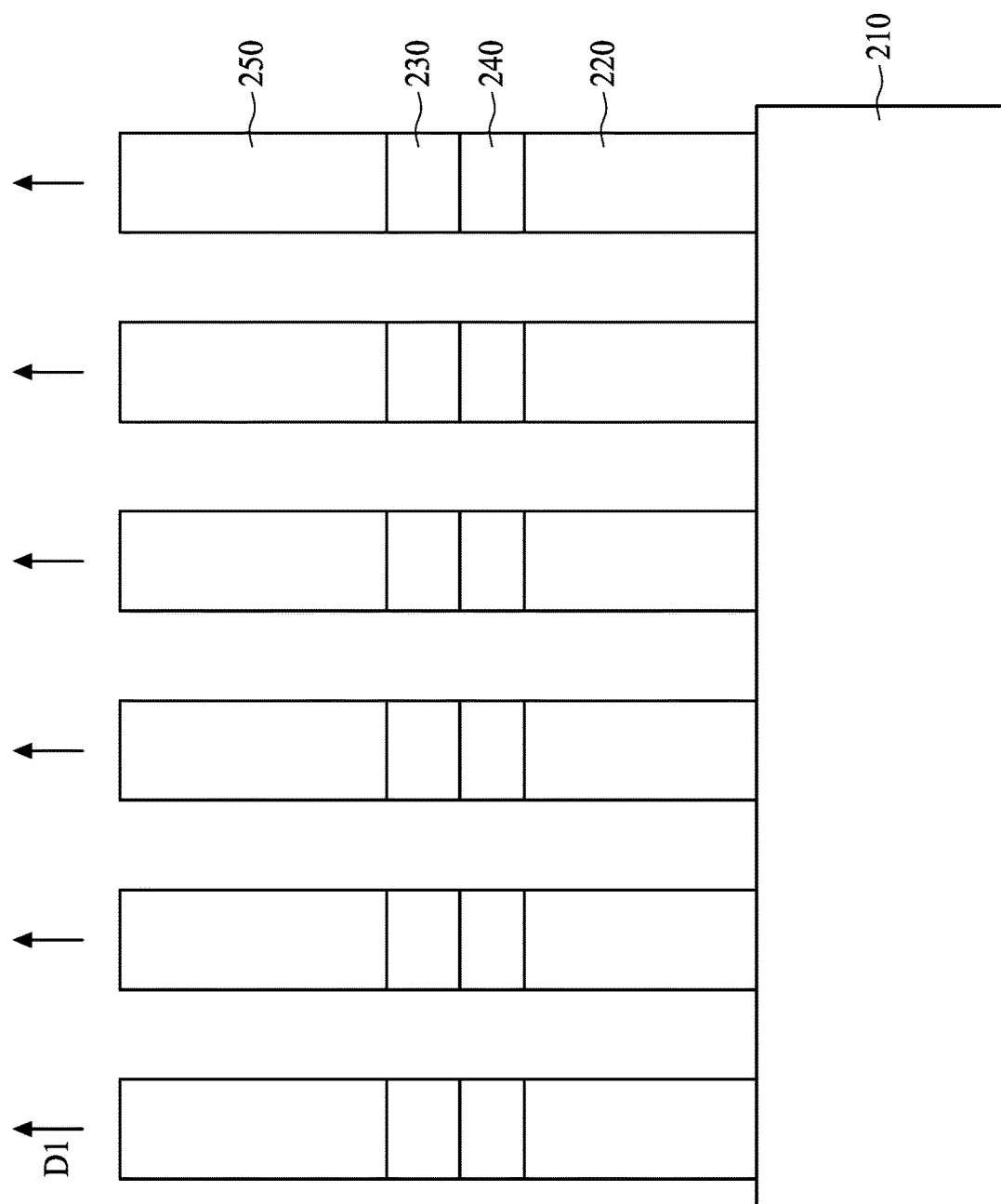
FIG. 19 illustrates a cross-sectional side view of a fin structure of the semiconductor structure in accordance with some embodiments of the present disclosure.

FIG. 19 illustrates a semiconductor structure comprising a substrate 210 and a fin structure extruding from the substrate 210 along a first direction D1. The fin structure comprises the second conductive type semiconductive layer 250, which is an P-type doped layer, stacking over the first conductive type semiconductive layer 220, which is an N-type doped layer, along the first direction D1, and the dielectric layer 240 sandwiched by the N-type doped layer and the P-type doped layer. The P-type doped layer further comprises a p-channel layer 230 adjacent to the dielectric layer 240.

Figure 20:
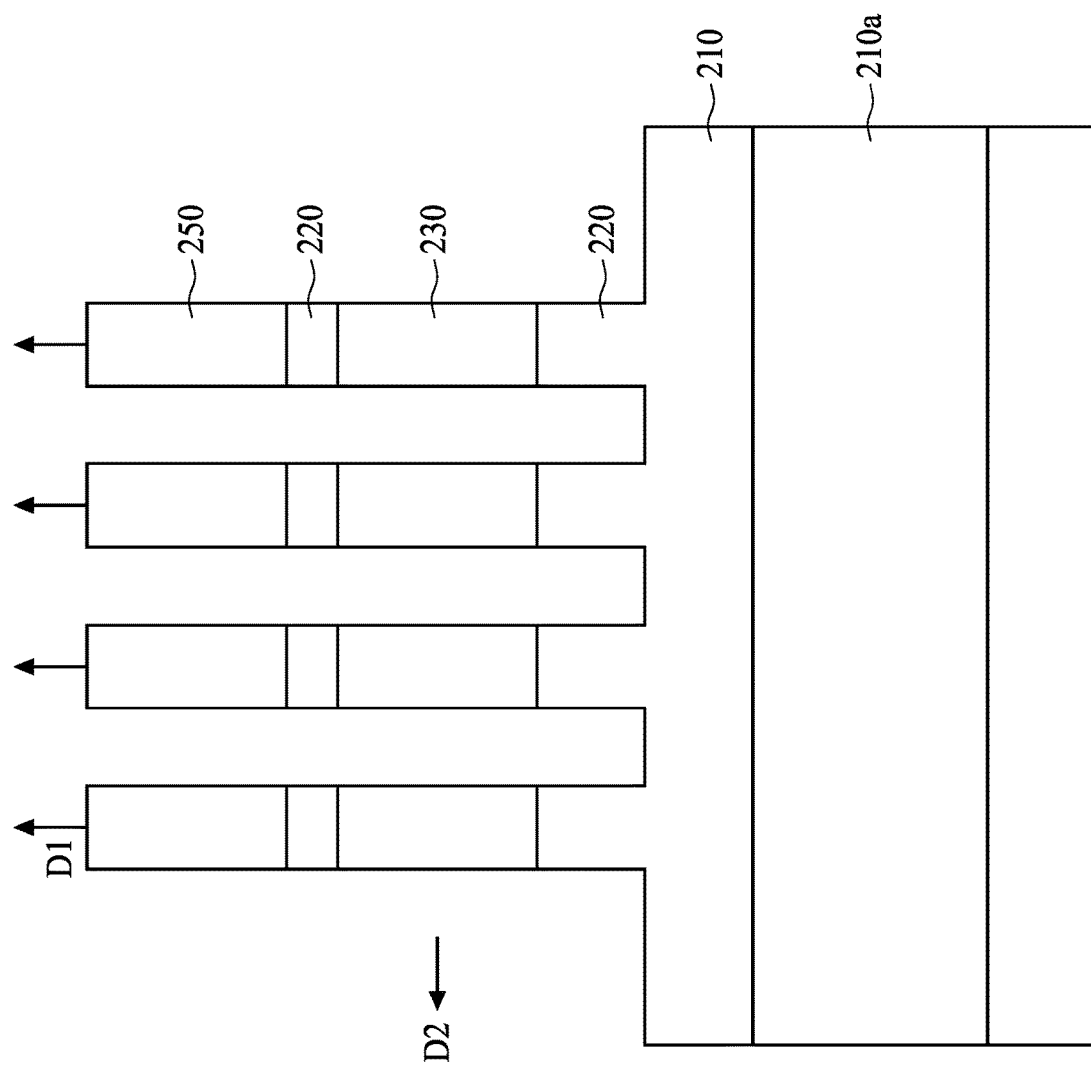
FIG. 20 illustrates a cross-sectional side view of a fin structure of the semiconductor structure in accordance with another embodiment of the present disclosure.
Figure 21:
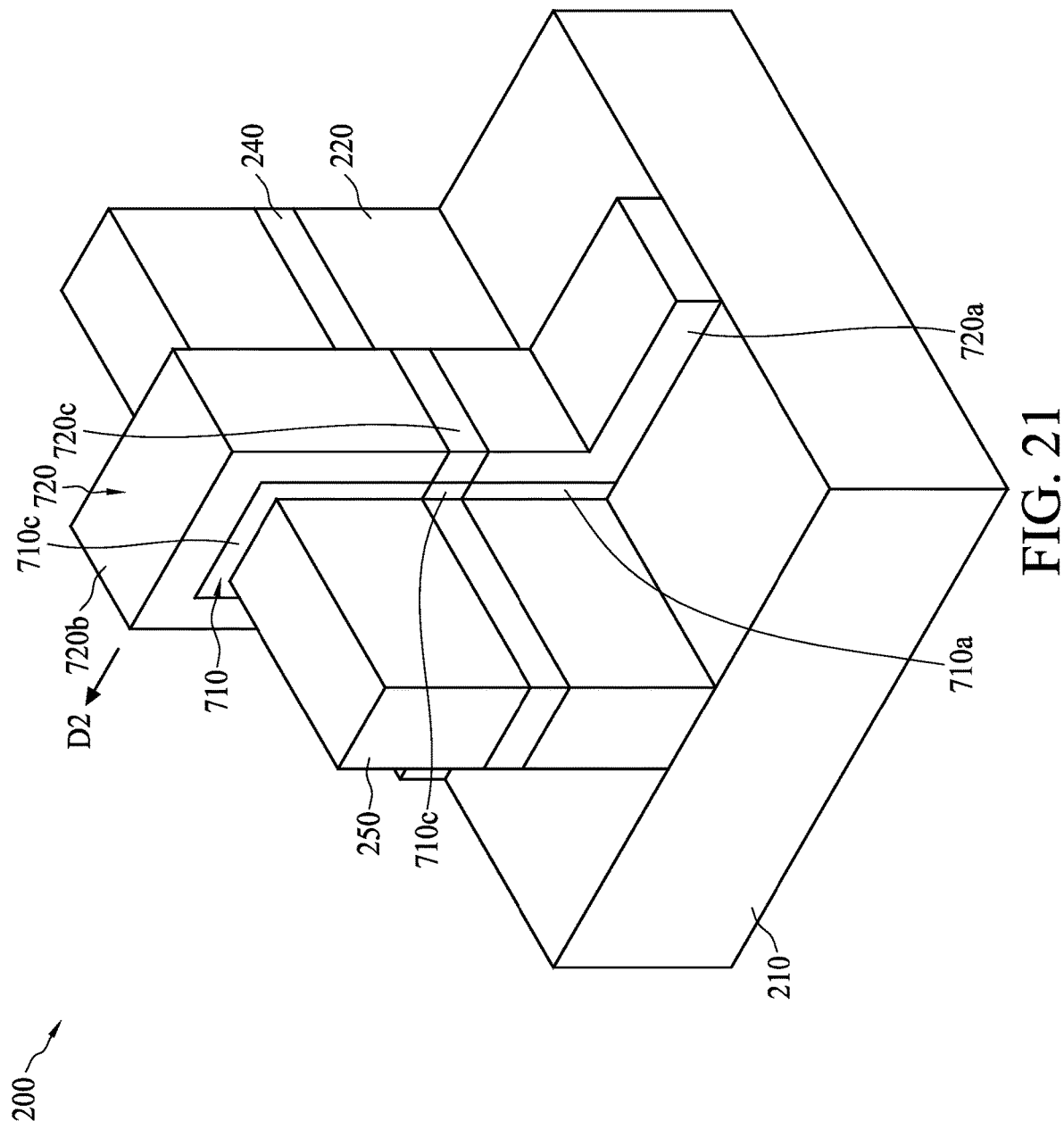
FIG. 21 illustrates a diagrammatic perspective view of the semiconductor structure in accordance with one embodiment of the present disclosure.

FIG. 20 illustrates a semiconductor structure comprising a substrate 210 and a fin structure extruding from the substrate 210 along a first direction D1. The substrate 210 has a silicon-on-insulator (SOI) structure with an insulator layer 210a in the substrate 210. An exemplary insulator layer 210a may be a buried oxide layer (BOX). In some embodiments, the insulator layer 210a has a thickness from about 50 nm to about 5 m. In some embodiments, the insulator layer 210a has a thickness from about 100 nm to about 3 m.

At operation 112, in which a conductive rail is formed over a portion of the fin structure. In some embodiments, a dummy gate structure may be formed over a portion of the fin structure. In some embodiments, each dummy gate structure is comprised of a dielectric layer and a dummy gate electrode. The dielectric layer may comprise silicon oxide, silicon oxynitride, high-k dielectric materials or a combination thereof. In some embodiments, the dummy gate electrode includes a single layer or multilayer structure. In the present embodiment, the dummy gate electrode includes polysilicon. The dummy gate structure may be formed by depositing materials of the dielectric layer and the dummy gate electrode over the substrate in a blanket manner. The deposition step may include physical vapor deposition (PVD), chemical vapor deposition (CVD), atomic layer deposition (ALD) or other suitable methods. A photoresist (not shown) is formed over the deposited materials and patterned. An etching operation is performed to transfer the features of the patterned photoresist to the underlying layers so as to form the dummy gate structure. In an embodiment, the dummy gate structure includes additional dielectric layers or conductive layers, e.g., hard mask layers, interfacial layers, capping layers or combinations thereof.

An etch stop layer (ESL) is then formed over the dummy gate structures. The ESL may include silicon nitride, silicon oxide, silicon oxynitride or other suitable materials. The ESL may be formed using any suitable operation, such as PVD, CVD or ALD. In some embodiments, the ESL is a contact etch stop layer (CESL) including silicon nitride.

A planarization operation is performed to remove excess portions of the ESL layer. The planarization operation may include a chemical mechanical polish (CMP) operation or mechanical grinding. The top surfaces of the dummy gate electrodes are exposed accordingly. In an embodiment, the top surfaces of the ESL layer and the dummy gate electrode are leveled by the planarization operation.

A metal gate structure for the respective fin structures is formed in place of the corresponding dummy gate structures. Initially, each dummy gate electrode is removed from the respective dummy gate structure. The dummy gate electrode may be removed in an etching operation, such as a wet etch, a dry etch or combinations thereof. In some embodiments, the dielectric layer is removed during the etching of the dummy gate electrode. In an embodiment, the wet etch operation for the dummy gate electrode includes exposure to a hydroxide containing solution (e.g., ammonium hydroxide), deionized water, or other suitable etchant solutions.

As shown in FIG. 21, in a FinFET device, a conductive rail lines along the second conductive type semiconductive layer 250 and extending on a second direction (D2) perpendicular to the first direction. A gate electrode 720 is adjacent to three side surfaces of a fin structure with a gate dielectric layer 710 interposed therebetween, so the method further includes forming a gate dielectric layer 710 and forming a gate electrode 720 including at least one barrier layer formed over the gate dielectric layer 710 and an oxide layer over the barrier layer. The gate dielectric layer 710 is formed over the fin structures. The gate dielectric layer 710 comprises two dielectric portions 710a and 710c and an isolation portion 710b sandwiched by the both dielectric portions 710a and 710c. The dielectric portions 710a and 710c and the isolation portion 710b correspond to the first conductive type semiconductive layer 220, the second conductive type semiconductive layer 250 and the dielectric layer 204, respectively. The dielectric portions 710a and 710c may be formed of a high-k dielectric material, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, or combinations thereof. Alternatively, the dielectric portions 710a and 710c may include silicon nitride, silicon oxynitride or silicon oxide. In some embodiments, the gate dielectric layer 710 may be formed using PVD, CVD or other suitable deposition methods. In some embodiments, the isolation portion 710b is made of materials as those used for the dielectric layer 240, such as a low-κ dielectric material, including nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof.

The barrier layer is formed over the gate dielectric layer 710 and intends to protect the gate dielectric layer 710 from metal impurities introduced in later steps. For example, in some embodiments, the gate structures will be formed to include one or more work function metal layers. Without the barrier layer, metal materials from those work function metal layers would diffuse into the gate dielectric layer 710, causing manufacturing defects. In various embodiments, the barrier layer includes a metal element. In some embodiments, the barrier layer includes tantalum nitride. In another embodiment, the barrier layer includes titanium nitride. In yet another embodiment, the barrier layer includes niobium nitride. Various other materials are suitable. In some embodiments, the barrier layer may be formed by ALD, PVD, CVD, or other suitable methods. In the present embodiment, the barrier layer has a thickness about 5 Å to about 20 Å.

It has been observed that, in some instances, the barrier layer alone may not provide sufficient protection to the gate dielectric layer. In one instance, multiple metal patterning processes are performed to form a work function metal layer over the barrier layer. This may be for fine tuning threshold voltage (Vt) of the FinFETs, as an example.

An oxide layer may be formed over the barrier layer by a variety of processes. In an embodiment, the oxide layer is formed by treating the barrier layer with a flow of oxygen. To further this embodiment, the barrier layer and the oxide layer contain a common metal element. In an embodiment, the barrier layer includes tantalum nitride and the oxide layer includes tantalum oxide. In another embodiment the barrier layer includes titanium nitride and the oxide layer includes titanium oxide. In yet another embodiment, the barrier layer includes niobium nitride and the oxide layer includes niobium oxide. In an embodiment, oxygen treatment of the barrier layer is performed in a dry etching tool. Alternatively, it may be performed in a dry ashing tool. In an embodiment, the oxygen treatment is performed under a pressure of about 1.5 mTorr, at a temperature of about 30° C. to about 60° C., with an oxygen flow of about 1 to about 100 mL/min, such as about 30 mL/min, and for about 5 to about 30 seconds. The oxide layer may be formed to about 5 Å to about 20 Å. However, other thickness may also be suitable.

In another embodiment, the oxide layer may be formed by one or more deposition processes. To further this embodiment, the barrier layer and the oxide layer may contain the same or different metal elements. For example, a layer of tantalum oxide (e.g., $Ta_2O_5$) may be deposited over the barrier layer under a pressure of about 1 to about 100 Torr, at a temperature of about 250° C. to about 400° C., and with tantalum tetraethoxy dimethylaminoethoxide as precursor gas and argon as carrier gas. For example, the flow rate of the precursor gas may be set to about 20 standard cubic centimeters per minute (sccm). In embodiments, deposition of titanium oxide or niobium oxide may be similarly performed. However, other suitable deposition techniques can also be used.

The gate electrode 720 comprising the barrier layer and oxide layer, in conformity with the dielectric portions 710*a* and 710*c* and the isolation portion 710*b* of the dielectric layer, is separated into two conductive portions 720*a* and 720*b* and an isolation portion 720*c* sandwiched between the conductive portions 720*a* and 720*b*.

Figure 22:
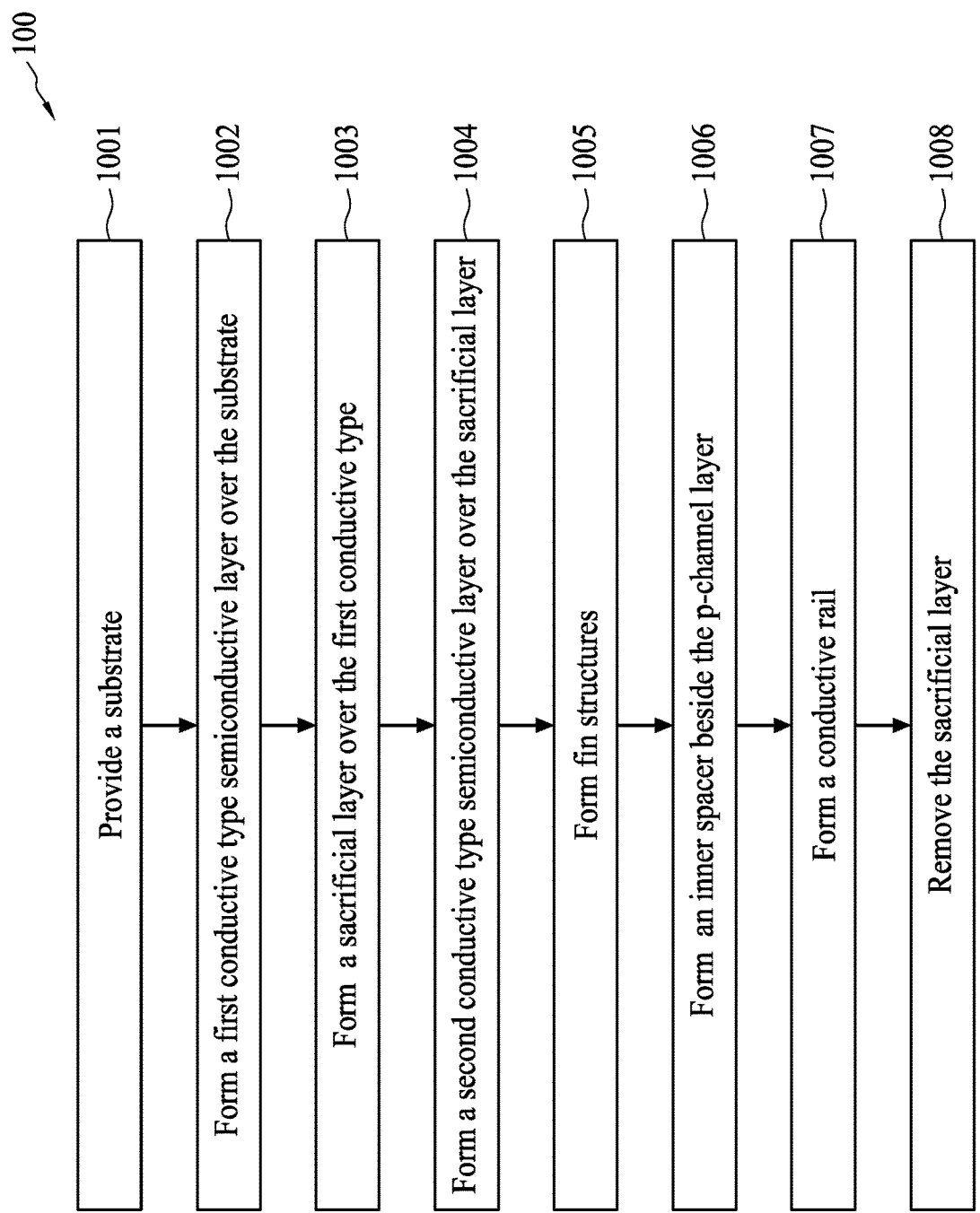
FIG. 22 is a flow chart illustrating a method of fabricating a semiconductor structure, in accordance with some embodiments of the present disclosure.

Method 1000 of forming a semiconductor structure is illustrated in FIG. 22, and one or more semiconductor structures formed by such a methodology are illustrated in FIGS. 23 to 28. The method 1000 includes a number of operations (e.g. 1001, 1002, 1003, 1004, 1005, 1006, 1007 and 1008). It should be noted that similar elements in FIGS. 2 to 21 and FIGS. 23 to 28 are designated by the same numerals, and can include similar materials, therefore those details are omitted in the interest of brevity. Method 1000 begins at operation 1001 where a substrate 210 is provided or received, which is followed by operation 1002 for forming a first conductive type semiconductive layer 220 over the substrate 210. In some embodiments, operations 1001 and 1002 are similar to operations 102 and 104 as described above.

Figure 23:
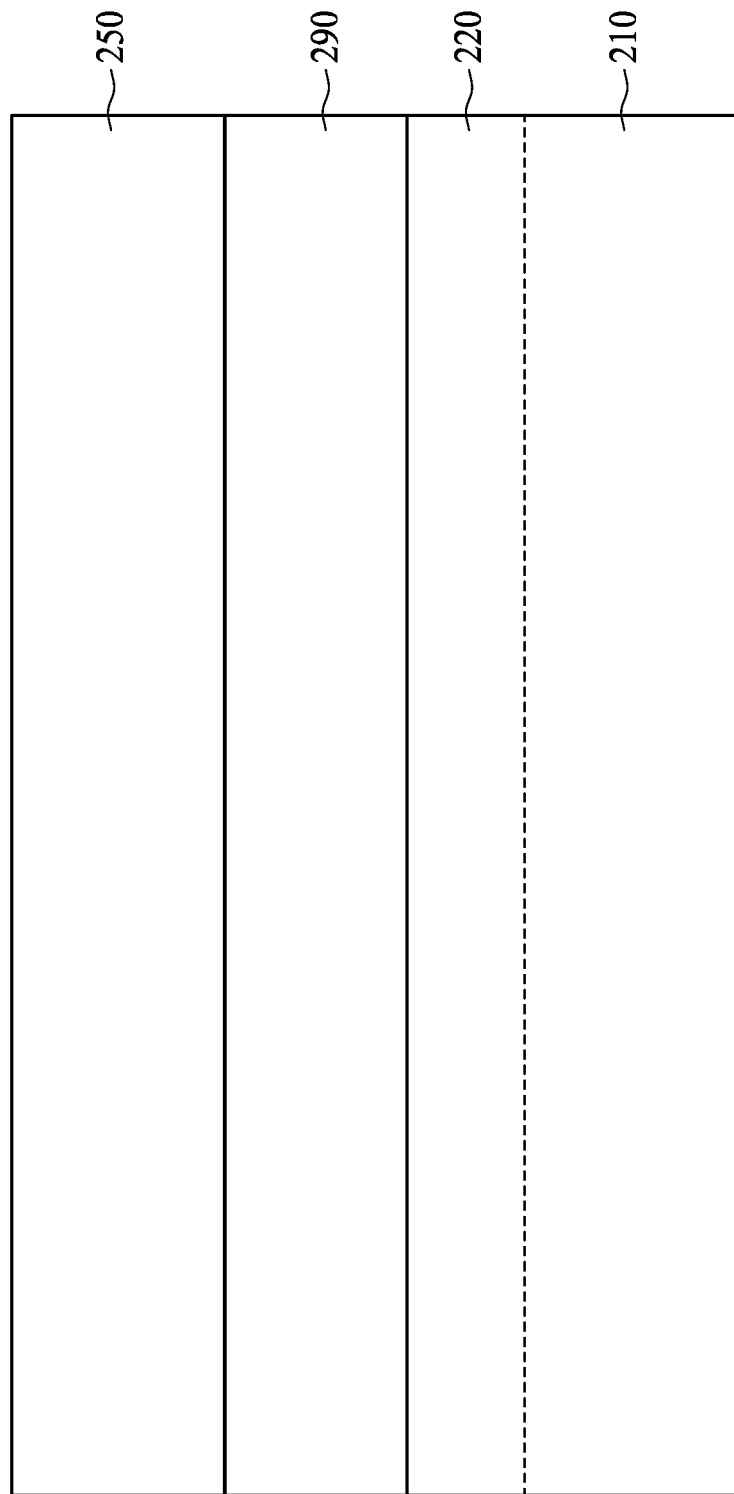
FIGS. 23 to 25 illustrate diagrammatic cross-sectional side views of various embodiments of a semiconductor structure at various stages of fabrication, according to the method of FIG. 22.

At operation 1003, with reference to FIG. 23, a sacrificial layer 290 is formed over the first conductive type semiconductive layer 220 through various methods before forming a second conductive type semiconductive layer 250 over the sacrificial layer 290 at operation 1004, so that the sacrificial layer 290 is sandwiched between the first conductive type semiconductive layer 220 and the second conductive type semiconductive layer 250. The sacrificial layer 290 may be made of Ge-containing materials, such as SiGe, Ge, GeSn and the like. In some embodiments, the sacrificial layer 290 may be made of SiGe. The method 1000 continues with operation 1005 where fin structures are formed. The fin structures may be fabricated using suitable operations including photolithography and etch operations. In some embodiments, operation 1005 is similar to operation 110 described above.

Figure 24:
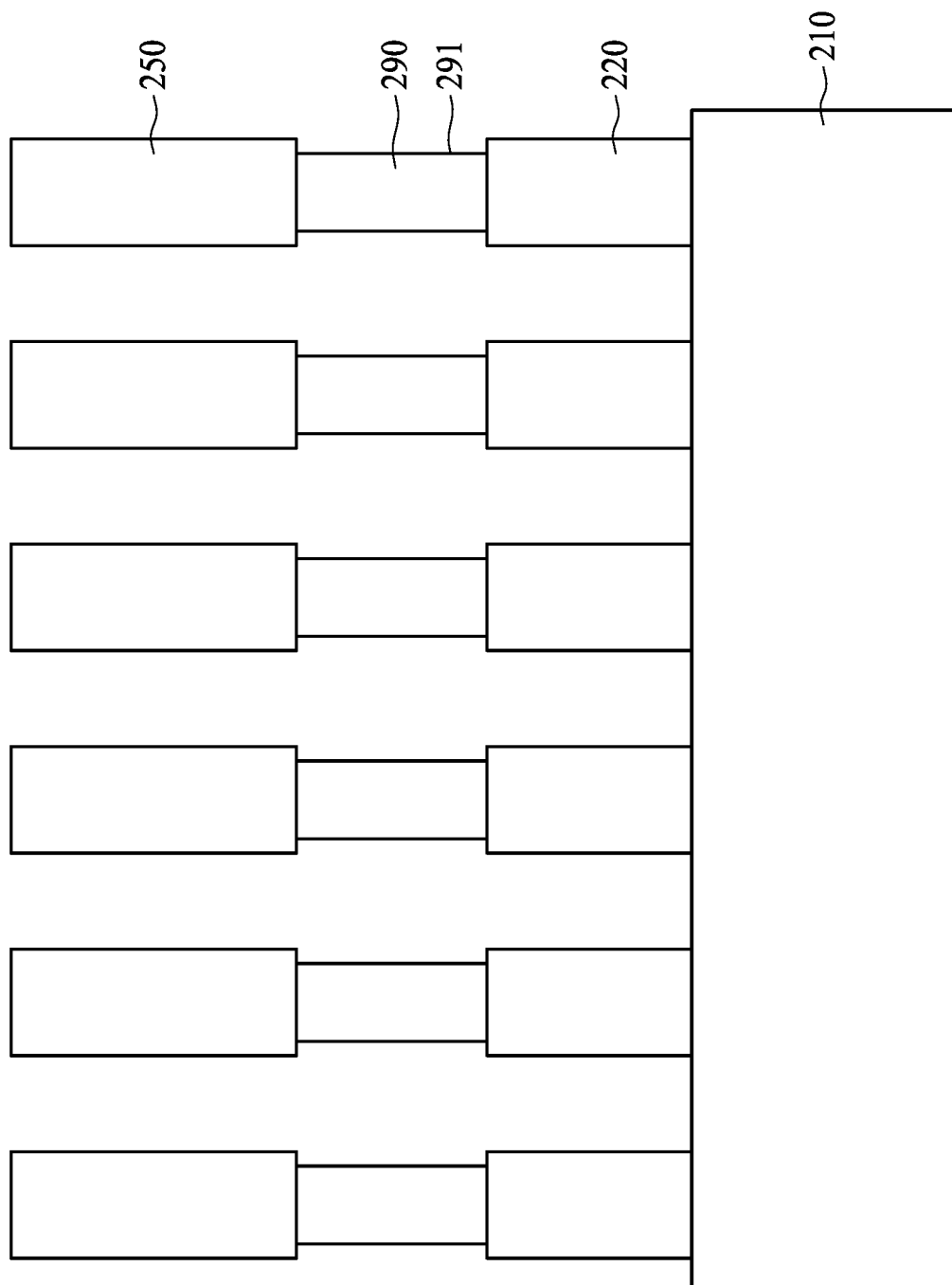

Method 1000 proceeds to operation 1006 where a plurality of notches 291 are formed beside the sacrificial layer 290 in the fin structure as shown in FIG. 23 before a plurality of inner spacers 292 are formed in the notches 291 as shown in FIG. 24.

Figure 25:
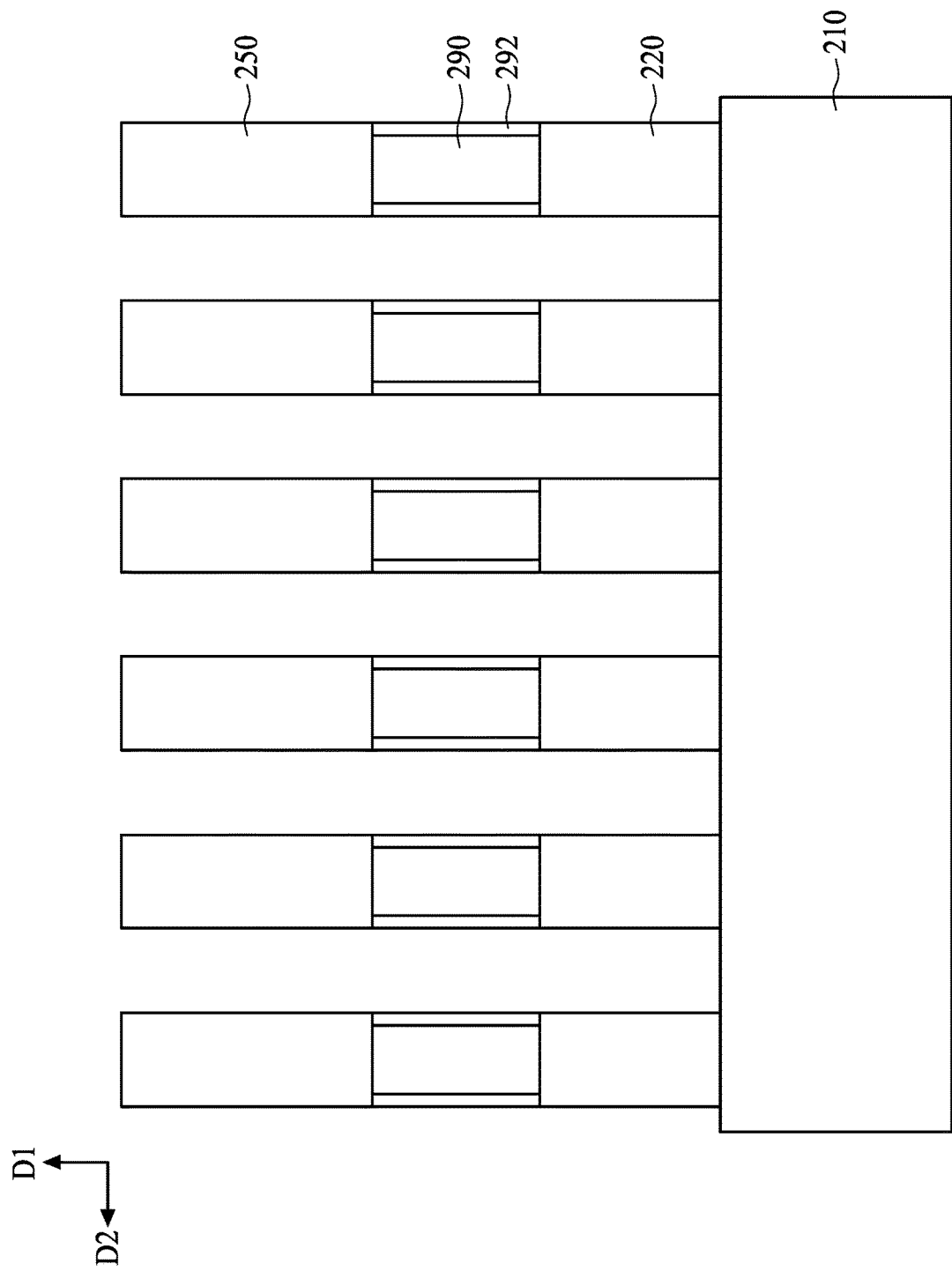
Figure 26:
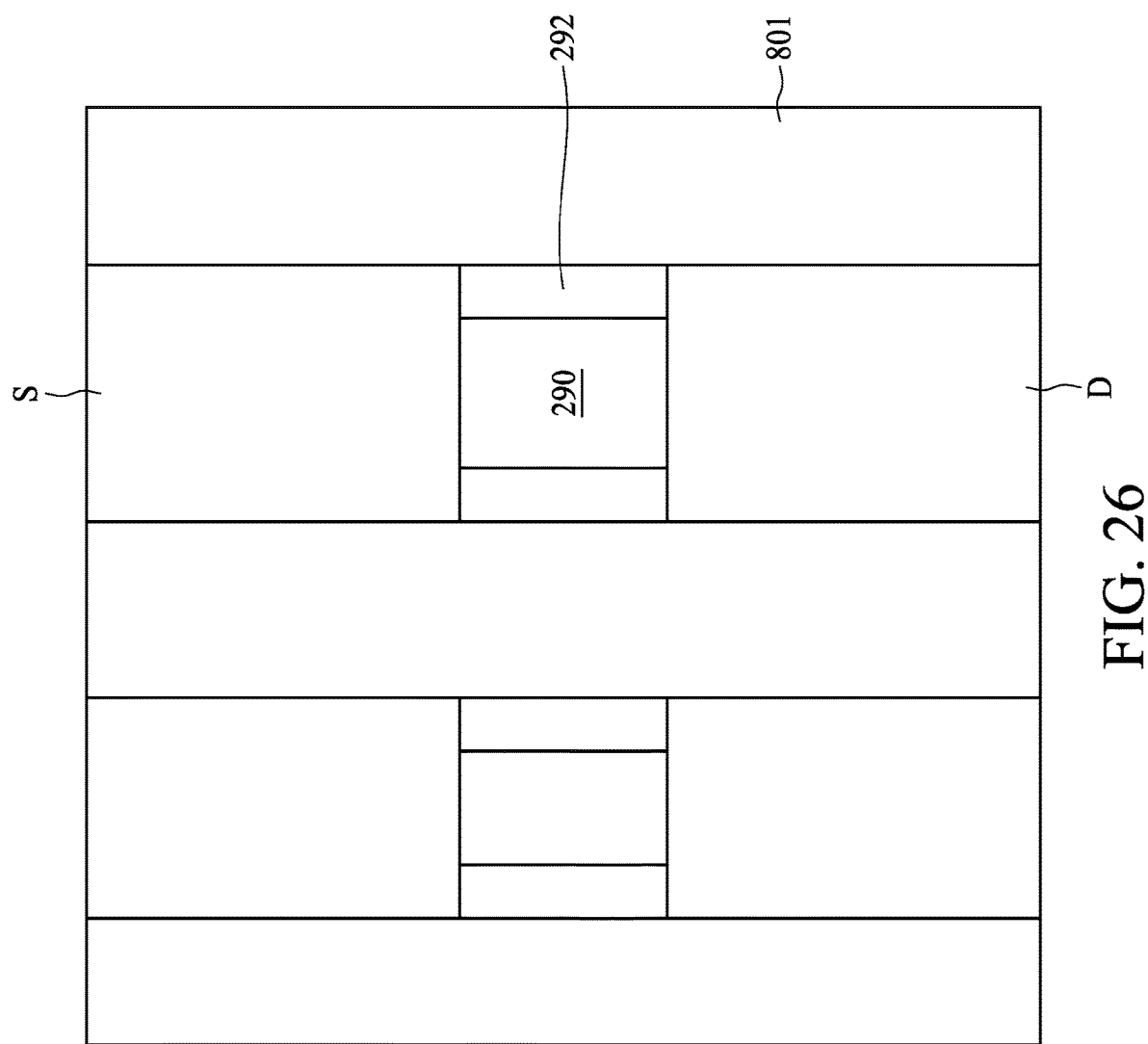
FIG. 26 illustrates a cross-sectional top view of a fin structure overlaid with a dummy gate, according to the method of FIG. 22.

At operation 1007, in which a conductive rail is formed over a portion of the fin structure. In some embodiments, a dummy gate structure is disposed over the fin structure and the substrate 210. The dummy gate structure may be replaced at a later processing stage by a high-K dielectric layer (HK) and metal gate electrode (MG). In some embodiments, the dummy gate structure is formed over the substrate 210 and extended along a second direction D2, which is not parallel with the first direction D1 as shown in FIG. 25. As shown in FIG. 26, the dummy gate structure 801 is at least partially disposed over the fin structure, and some portions of the fin structure underlying the dummy gate structure 801 may be referred to as channel regions. The dummy gate structure 801 may also define a source region S and a drain region D of the fin structures, for example, as portions of the fin structure adjacent to and on opposing sides of the channel regions. In some embodiments, the dummy gate structure 801 may include at least a polysilicon layer and a patterned hard mask for defining the dummy gate structure.

Figure 27:
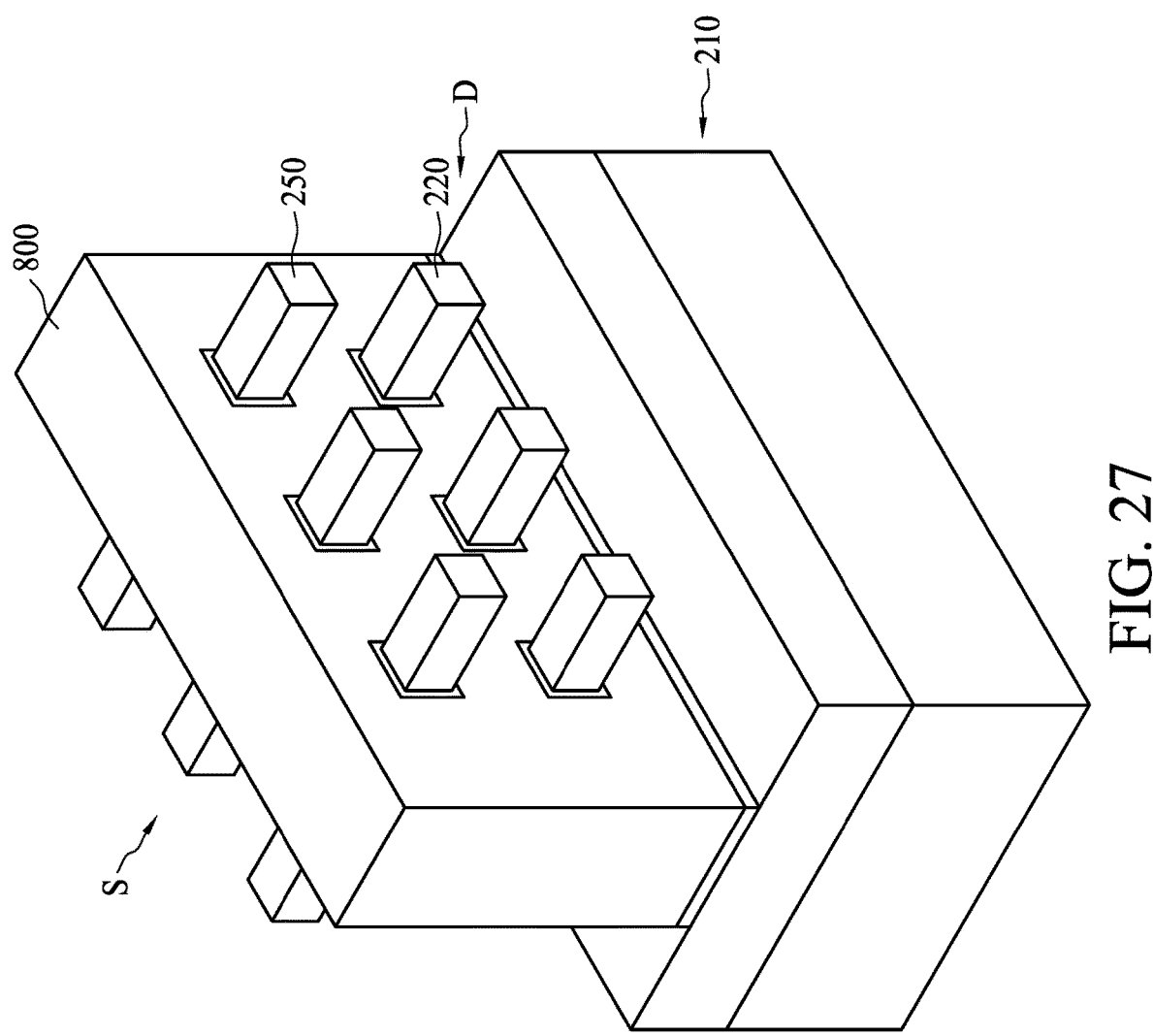
FIG. 27 illustrates a diagrammatic perspective view of the semiconductor structure in accordance with another embodiment of the present disclosure.

Method 1000 continues with operation 1008 where the sacrificial layer 290 with inner spacers 292 are removed and the dummy gate 801 is replaced with metal gate 800, so the semiconductor structure as shown in FIG. 27 comprises the substrate 210, a metal gate 800 formed over the substrate 210, a plurality of the first conductive type semiconductive layers 220 and a plurality of the second conductive type semiconductive layers 250 where the first conductive type semiconductive layers 220 and the second conductive type semiconductive layers 250 are separated by the metal gate 800. In this manner, all side surfaces of channel regions of the fin structures are surrounded by gate structures, which allows for fully depletion in the channel region and results in fewer short-channel effects due to a steeper sub-threshold current swing (SS) and smaller drain-induced barrier lowing (DIBL).

Figure 28:
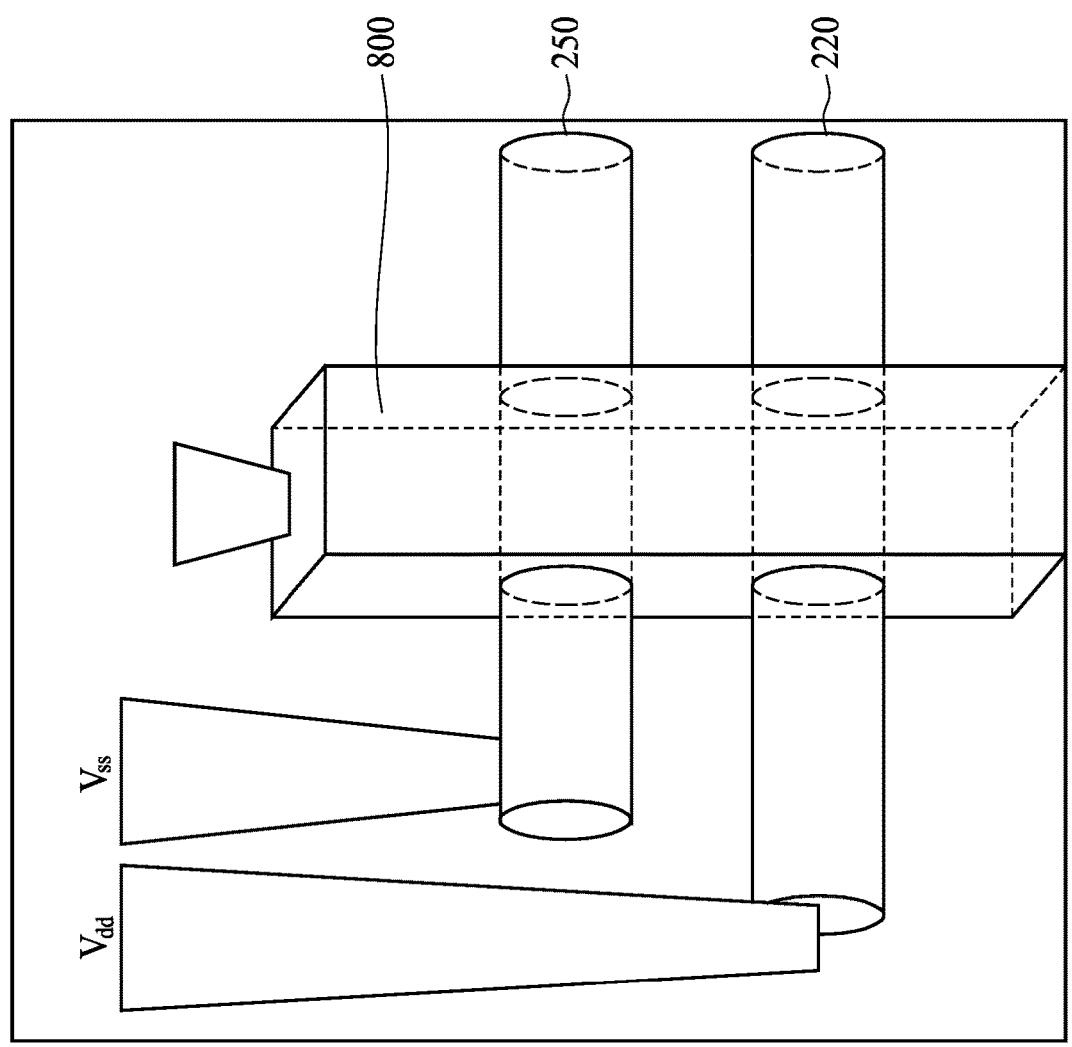
FIG. 28 illustrates a simplified diagrammatic view of the semiconductor structure in accordance with FIG. 27.

In some embodiments, the gate structure 800 defines a source region S and a drain region D of the fin structures as shown in FIG. 26. The first conductive type semiconductive layers 220 is an n-type doped layer and the second conductive type semiconductive layers 250 is a p-type doped layer. As shown in FIG. 28, the first conductive type semiconductive layers 220, the second conductive type semiconductive layers 250 and the gate 800 are respectively connected to the supplies (Vdd/Vss).

In some embodiments, methods 100, 1000 may continue to provide steps of fabricating other features of semiconductor elements, including, for example, forming contact, interconnect structures, and/or other suitable processes and features.

Additional steps can be provided before, during, and after the methods 100, 1000, and some of the steps described can be replaced or eliminated for other embodiments of the method. The discussion that follows illustrates various embodiments of a semiconductor structure that can be fabricated according to method 100 of FIG. 1 or method 1000 of FIG. 22.

In accordance with one embodiment of the present disclosure, a semiconductor structure includes: a substrate and a fin protruding from the substrate. The fin comprises a first semiconductive layer over the substrate, a second semiconductive layer over the first semiconductive layer, and a dielectric layer disposed between the first semiconductive layer and the second semiconductive layer and electrically isolated from the first semiconductive layer and the second semiconductive layer. The semiconductor structure further includes a gate electrode including: a first conductive portion extending along two opposite sidewalls of the first semiconductive layer and along an upper surface of the substrate; and a second conductive portion electrically isolated from the first conductive portion and extending along two opposite sidewalls of the second semiconductive layer and along an upper surface of the fin.

In accordance with one embodiment of the present disclosure, a semiconductor structure includes: a substrate; a first type Fin field-effect transistor (FinFET) comprising a first fin over the substrate; a second type FinFET comprising a second fin over the first fin; a dielectric layer electrically isolating the first type FinFET from the second type FinFET; and a gate electrode straddling the first fin, the dielectric layer and the second fin. The gate electrode includes a first conductive portion including two first portions arranged on two sides of the first fin and parallel to the first fin; a second conductive portion including two second portions on two sides and a third portion on an upper surface of the second fin; and an isolation portion including two portions connecting the first portions of the first conductive portion to the second portions of the second conductive portion, respectively.

In some embodiments, a method of manufacturing a semiconductor structure including: providing a substrate; depositing a first semiconductive layer, a dielectric layer and a second semiconductive layer in sequence over the substrate; patterning the second semiconductive layer into a fin shape; converting sidewalls of the second semiconductive layer into a first sacrificial film; patterning the dielectric layer and the first semiconductive layer and etching at least part the first sacrificial film to thereby form a fin including the first semiconductive layer, the dielectric layer and the second semiconductive layer; and depositing a gate electrode to straddle the fin, the gate electrode comprising a first conductive portion, an isolation portion and a second conductive portion aligned with the first semiconductive layer, the dielectric layer and the second semiconductive layer, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
    a substrate;
    a fin protruding from the substrate, wherein the fin comprises a first semiconductive layer over the substrate, a second semiconductive layer over the first semiconductive layer, and a dielectric layer disposed between the first semiconductive layer and the second semiconductive layer and electrically isolated from the first semiconductive layer and the second semiconductive layer; and
    a gate electrode comprising:
       a first conductive portion extending along two opposite sidewalls of the first semiconductive layer and along an upper surface of the substrate; and
       a second conductive portion electrically isolated from the first conductive portion and extending along two opposite sidewalls of the second semiconductive layer and along an upper surface of the fin.

2. The semiconductor structure of claim 1, wherein the dielectric layer is made of a material with a dielectric constant from about 3 to about 25.

3. The semiconductor structure of claim 1, wherein the fin has a trapezoidal or rectangular cross section viewed from a cross-sectional view.

4. The semiconductor structure of claim 1, wherein at least 50% of an area of a sidewall of the fin is corrugated.

5. The semiconductor structure of claim 1, wherein the fin has a corrugated sidewall with a plurality of recesses, wherein each of the plurality of recesses has a diameter from about 1 nm to about 10 nm.

6. The semiconductor structure of claim 1, wherein the dielectric layer has an oblate shape with a top and a bottom, wherein the top and the bottom are narrower than a middle portion of the dielectric layer.

7. The semiconductor structure of claim 1, wherein the dielectric layer has a gourd shape.

8. The semiconductor structure of claim 1, wherein the first semiconductive layer in the fin has a rectangular vertical cross section, the dielectric layer in the fin has a trapezoidal vertical cross section, and the second semiconductive layer has a rectangular vertical cross section.

9. A semiconductor structure, comprising:
    a substrate;
    a first type Fin field-effect transistor (FinFET) comprising a first fin over the substrate;
    a second type FinFET comprising a second fin over the first fin;
    a dielectric layer electrically isolating the first type FinFET from the second type FinFET; and
    a gate electrode straddling the first fin, the dielectric layer and the second fin, the gate electrode comprising:
       a first conductive portion comprising two first portions arranged on two sides of the first fin and parallel to the first fin; a second conductive portion comprising two second portions on two sides and a third portion on an upper surface of the second fin; and
       an isolation portion comprising two portions connecting the first portions of the first conductive portion to the second portions of the second conductive portion, respectively.

10. The semiconductor structure of claim 9, wherein the dielectric layer has an upper surface level with an upper surface of the isolation portion.

11. The semiconductor structure of claim 9, wherein the dielectric layer is made of a material with a dielectric constant from about 3 to about 25.

12. The semiconductor structure of claim 9, wherein one of the first type FinFET and the second type FinFET comprises a p-channel layer adjacent to the dielectric layer.

13. The semiconductor structure of claim 12, wherein the p-channel layer has a thickness between about 20 nm and about 80 nm.

14. The semiconductor structure of claim 9, wherein the dielectric layer has a thickness from about 10 nm to about 30 nm and the second type FinFET has a thickness from about 20 nm to about 150 nm.

15. The semiconductor structure of claim 9, further comprising a gate dielectric layer between the gate electrode and a stack formed of the first type FinFET, the dielectric layer and the second type FinFET.

16. A method of manufacturing a semiconductor structure, comprising:
- providing a substrate;
- depositing a first semiconductive layer, a dielectric layer and a second semiconductive layer in sequence over the substrate;
- patterning the second semiconductive layer into a fin shape;
- converting sidewalls of the second semiconductive layer into a first sacrificial film;
- patterning the dielectric layer and the first semiconductive layer and etching at least part the first sacrificial film to thereby form a fin including the first semiconductive layer, the dielectric layer and the second semiconductive layer; and
- depositing a gate electrode to straddle the fin, the gate electrode comprising a first conductive portion, an isolation portion and a second conductive portion aligned with the first semiconductive layer, the dielectric layer and the second semiconductive layer, respectively.

17. The method of claim 16, wherein the converting of the sidewalls of the second semiconductive layer into the first sacrificial film comprises oxidizing the sidewalls.

18. The method of claim 16, further comprises, prior to patterning the first semiconductive layer, forming a second sacrificial film surrounding the second semiconductive layer and the dielectric layer.

19. The method of claim 16, further comprising forming a gate dielectric layer between the fin and the gate electrode.

20. The method of claim 16, wherein the dielectric layer is made of a material with a dielectric constant from about 3 to about 25.

* * * * *